(12) United States Patent
Ochi et al.

(10) Patent No.: US 10,826,019 B2
(45) Date of Patent: Nov. 3, 2020

(54) ORGANIC EL DISPLAY DEVICE

(71) Applicant: Sharp Kabushiki Kaisha, Sakai, Osaka (JP)

(72) Inventors: Takashi Ochi, Sakai (JP); Mamoru Ishida, Sakai (JP); Tohru Sonoda, Sakai (JP); Tohru Senoo, Sakai (JP); Takeshi Hirase, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 44 days.

(21) Appl. No.: 16/314,869

(22) PCT Filed: Aug. 10, 2017

(86) PCT No.: PCT/JP2017/029160
§ 371 (c)(1),
(2) Date: Jan. 3, 2019

(87) PCT Pub. No.: WO2018/034244
PCT Pub. Date: Feb. 22, 2018

(65) Prior Publication Data
US 2019/0312230 A1   Oct. 10, 2019

(30) Foreign Application Priority Data
Aug. 18, 2016 (JP) .................. 2016-160628

(51) Int. Cl.
*H01L 27/32* (2006.01)
*H01L 51/52* (2006.01)
(Continued)

(52) U.S. Cl.
CPC ............ *H01L 51/5256* (2013.01); *G02B 1/14* (2015.01); *G02B 5/20* (2013.01); *G09F 9/30* (2013.01);
(Continued)

(58) Field of Classification Search
None
See application file for complete search history.

(56) References Cited

U.S. PATENT DOCUMENTS

2013/0258565 A1  10/2013  Nishi
2015/0144916 A1   5/2015  Ohara et al.
(Continued)

FOREIGN PATENT DOCUMENTS

JP  2013-210491 A  10/2013
JP  2015-103467 A   6/2015
(Continued)

*Primary Examiner* — Jack S Chen
(74) *Attorney, Agent, or Firm* — Keating & Bennett, LLP

(57) ABSTRACT

A display device includes: a plurality of organic layers each made of an organic material and each having a predetermined modulus of elasticity and a predetermined thickness; and a plurality of inorganic layers each made of an inorganic material and each having a predetermined modulus of elasticity and a predetermined thickness. The plurality of organic layers and the plurality of inorganic layers are stacked together to constitute a device body which forms the display device. A quotient obtained by dividing the sum of flexural rigidities of the plurality of inorganic layers by the sum total of the sum of flexural rigidities of the plurality of organic layers and the sum of the flexural rigidities of the plurality of inorganic layers is 0.78 or higher and 1 or lower.

12 Claims, 21 Drawing Sheets

(51) Int. Cl.
    *G09F 9/30*     (2006.01)
    *H05B 33/04*     (2006.01)
    *G02B 1/14*     (2015.01)
    *H05B 33/02*     (2006.01)
    *H05B 33/12*     (2006.01)
    *H01L 51/50*     (2006.01)
    *G02B 5/20*     (2006.01)

(52) U.S. Cl.
    CPC ............ *H01L 27/32* (2013.01); *H01L 27/322* (2013.01); *H01L 27/323* (2013.01); *H01L 51/50* (2013.01); *H01L 51/5246* (2013.01); *H05B 33/02* (2013.01); *H05B 33/04* (2013.01); *H05B 33/12* (2013.01); *H01L 2251/558* (2013.01)

(56) References Cited

U.S. PATENT DOCUMENTS

2015/0346866 A1     12/2015     Kusunoki et al.
2017/0365815 A1     12/2017     Sonoda et al.
2019/0312230 A1*     10/2019     Ochi ..................... H01L 27/322

FOREIGN PATENT DOCUMENTS

JP     2016-110613 A     6/2016
WO     2016/088355 A1     6/2016

\* cited by examiner

FIG.6

| No. | | MATERIAL | THICKNESS [μm] | MODULUS OF ELASTICITY [GPa] | $E_i I_i$ [Pa·m⁴] | $E_i I_i / \Sigma E_i I_i \times 100$ [%] |
|---|---|---|---|---|---|---|
| 1 | HARD COAT LAYER | INORGANIC | 3.3 | 81 | $9.3 \times 10^{-5}$ | 52.9 |
| 2 | HARD COAT SUBSTRATE | ORGANIC | 5 | 3.53 | $5.3 \times 10^{-6}$ | 3.0 |
| 3 | THIRD ADHESIVE LAYER | ORGANIC | 5 | 0.1 | $1.2 \times 10^{-7}$ | 0.1 |
| 4 | TOUCH PANEL'S SECOND INTERCONNECTING LAYER | INORGANIC | 0.1 | 120 | $2.7 \times 10^{-6}$ | 1.5 |
| 5 | TOUCH PANEL SUBSTRATE | ORGANIC | 16 | 3.5 | $8.7 \times 10^{-6}$ | 5.0 |
| 6 | TOUCH PANEL'S FIRST INTERCONNECTING LAYER | INORGANIC | 0.1 | 120 | $1.2 \times 10^{-6}$ | 0.7 |
| 7 | SECOND ADHESIVE LAYER | ORGANIC | 15 | 0.1 | $8.6 \times 10^{-8}$ | 0.0 |
| 8 | COLOR FILTER SUBSTRATE | ORGANIC | 12 | 4.64 | $6.2 \times 10^{-7}$ | 0.4 |
| 9 | SECOND MOISTURE-PROOF LAYER | INORGANIC | 0.5 | 228 | $1.6 \times 10^{-7}$ | 0.1 |
| 10 | COLOR FILTER | ORGANIC | 5 | 2.22 | $3.4 \times 10^{-9}$ | 0.0 |
| 11 | FIRST MOISTURE-PROOF LAYER | INORGANIC | 0.1 | 228 | $5.5 \times 10^{-9}$ | 0.0 |
| 12 | FILLING LAYER | ORGANIC | 6 | 4.41 | $6.4 \times 10^{-8}$ | 0.0 |
| 13 | SEALING FILM | INORGANIC | 3.5 | 81 | $2.5 \times 10^{-6}$ | 1.4 |
| 14 | ORGANIC EL LAYER | ORGANIC | 0.5 | 0 | – | 0.0 |
| 15 | SECOND PROTECTIVE INSULATING FILM | ORGANIC | 5 | 4.7 | $4.7 \times 10^{-7}$ | 0.3 |
| 16 | FIRST PROTECTIVE INSULATING FILM | INORGANIC | 0.15 | 228 | $9.5 \times 10^{-7}$ | 0.5 |
| 17 | THIRD INTERLAYER INSULATING FILM | INORGANIC | 0.2 | 59 | $3.3 \times 10^{-7}$ | 0.2 |
| 18 | SECOND INTERLAYER INSULATING FILM | INORGANIC | 0.1 | 228 | $6.6 \times 10^{-7}$ | 0.4 |
| 19 | FIRST INTERLAYER INSULATING FILM | INORGANIC | 0.05 | 59 | $8.6 \times 10^{-8}$ | 0.0 |
| 20 | SECOND GATE ELECTRODE LAYER | INORGANIC | 0.3 | 120 | $1.1 \times 10^{-6}$ | 0.6 |
| 21 | FIRST GATE ELECTRODE LAYER | INORGANIC | 0.05 | 120 | $1.8 \times 10^{-7}$ | 0.1 |
| 22 | GATE INSULATING FILM | INORGANIC | 0.05 | 59 | $9.0 \times 10^{-8}$ | 0.1 |
| 23 | SECOND BASE COAT FILM | INORGANIC | 0.1 | 59 | $1.8 \times 10^{-7}$ | 0.1 |
| 24 | FIRST BASE COAT FILM | INORGANIC | 0.5 | 228 | $3.6 \times 10^{-6}$ | 2.1 |
| 25 | RESIN SUBSTRATE LAYER | ORGANIC | 12 | 6.51 | $4.6 \times 10^{-6}$ | 2.6 |
| 26 | FIRST ADHESIVE LAYER | ORGANIC | 5 | 0.1 | $5.3 \times 10^{-8}$ | 0.0 |
| 27 | STRESS ADJUSTING LAYER | ORGANIC | 5 | 3.53 | $2.5 \times 10^{-6}$ | 1.4 |
| 28 | RIGIDIFYING LAYER | INORGANIC | 3.31 | 80 | $4.6 \times 10^{-5}$ | 26.4 |

FIG.10

| RETENTION PERIOD | | RADIUS OF CREASE $r_b$[mm] | | | | |
|---|---|---|---|---|---|---|
| [SECOND] | [HOUR] | a | b | c | d | e |
| 1 | 0 | 2,000 | 2,000 | 2,000 | 2,000 | 2,000 |
| 1800 | 0.5 | – | 30 | – | – | – |
| 3600 | 1.0 | – | 23 | 90 | 68 | 540 |
| 7200 | 2 | 19 | – | – | – | – |
| 86400 | 24.0 | 14 | – | 60 | 45 | 180 |
| 172800 | 48.0 | 13 | – | – | – | – |
| 259200 | 72.0 | – | – | – | 36 | 180 |
| 345600 | 96 | – | – | 54 | – | – |
| 518400 | 144 | – | 14 | – | – | – |
| 604800 | 168 | 10 | – | 42 | 34 | 135 |
| 864000 | 240 | – | 13 | – | – | – |
| 1000000 | 278 | – | – | – | – | 135 |
| 1641600 | 456 | – | 12 | – | – | – |
| 2592000 | 720 | 9 | – | 39 | 30 | 135 |

FIG.11

| RETENTION PERIOD | | CURVATURE OF CREASE($1/r_b$) | | | | |
|---|---|---|---|---|---|---|
| [SECOND] | [HOUR] | a | b | c | d | e |
| 1 | 0 | 0.0005 | 0.0005 | 0.0005 | 0.0005 | 0.0005 |
| 1800 | 0.5 | – | 0.03 | – | – | – |
| 3600 | 1.0 | – | 0.04 | 0.01 | 0.01 | 0.00 |
| 7200 | 2 | 0.05 | – | – | – | – |
| 86400 | 24.0 | 0.07 | – | 0.02 | 0.02 | 0.01 |
| 172800 | 48.0 | 0.08 | – | – | – | – |
| 259200 | 72.0 | – | – | – | 0.03 | 0.01 |
| 345600 | 96 | – | – | 0.02 | – | – |
| 518400 | 144 | – | 0.07 | – | – | – |
| 604800 | 168 | 0.10 | – | 0.02 | 0.03 | 0.01 |
| 864000 | 240 | – | 0.08 | – | – | – |
| 1000000 | 278 | – | – | – | – | 0.01 |
| 1641600 | 456 | – | 0.08 | – | – | – |
| 2592000 | 720 | 0.11 | – | 0.03 | 0.03 | 0.01 |

TIME PERIOD DURING WHICH DEVICE WAS KEPT BENT [sec.]

| TEST EXAMPLE | RADIUS OF CREASE $r_c$ [mm] | INORGANIC RIGIDITY RATE |
|---|---|---|
| 1 | 100 | 0.87 |
| 2 | 22 | 0.06 |
| 3 | 35 | 0.54 |
| 4 | 41 | 0.56 |
| 5 | 55 | 0.73 |
| 6 | 101 | 0.83 |
| 7 | 25 | 0.20 |
| 8 | 72 | 0.80 |
| 9 | 29 | 0.29 |
| 10 | 46 | 0.67 |
| 11 | 110 | 0.83 |
| 12 | 128 | 0.83 |

FIG.16

| No. | | MATERIAL | THICKNESS [μm] | MODULUS OF ELASTICITY [GPa] | $E_i I_i$ [Pa·m⁴] | $E_i I_i / \Sigma E_i I_i \times 100$ [%] |
|---|---|---|---|---|---|---|
| 1 | HARD COAT LAYER | INORGANIC | 2 | 81 | $1.7 \times 10^{-5}$ | 55.6 |
| 2 | HARD COAT SUBSTRATE | ORGANIC | 5 | 2 | $8.2 \times 10^{-7}$ | 2.7 |
| 3 | ADHESIVE LAYER | ORGANIC | 5 | 0.1 | $2.8 \times 10^{-8}$ | 0.1 |
| 4 | COLOR FILTER SUBSTRATE | ORGANIC | 10 | 2 | $5.3 \times 10^{-7}$ | 1.8 |
| 5 | SECOND MOISTURE-PROOF LAYER | INORGANIC | 1 | 228 | $2.5 \times 10^{-6}$ | 8.4 |
| 6 | TOUCH PANEL'S SECOND INTERCONNECTING LAYER | INORGANIC | 0.1 | 120 | $1.2 \times 10^{-7}$ | 0.4 |
| 7 | TOUCH PANEL SUBSTRATE | ORGANIC | 5 | 2 | $5.7 \times 10^{-8}$ | 0.2 |
| 8 | TOUCH PANEL'S FIRST INTERCONNECTING LAYER | INORGANIC | 0.1 | 120 | $2.8 \times 10^{-8}$ | 0.1 |
| 9 | COLOR FILTER | ORGANIC | 5 | 2.22 | $8.3 \times 10^{-9}$ | 0.0 |
| 10 | FIRST MOISTURE-PROOF LAYER | INORGANIC | 0.1 | 228 | $1.3 \times 10^{-10}$ | 0.0 |
| 11 | FILLING LAYER | ORGANIC | 6 | 4.41 | $3.6 \times 10^{-8}$ | 0.1 |
| 12 | SEALING FILM | INORGANIC | 3.5 | 200 | $4.6 \times 10^{-6}$ | 15.4 |
| 13 | ORGANIC EL LAYER | ORGANIC | 0.5 | 0 | – | 0.0 |
| 14 | SECOND PROTECTIVE INSULATING FILM | ORGANIC | 5 | 4.7 | $3.9 \times 10^{-7}$ | 1.3 |
| 15 | FIRST PROTECTIVE INSULATING FILM | INORGANIC | 0.15 | 228 | $8.1 \times 10^{-7}$ | 2.7 |
| 16 | THIRD INTERLAYER INSULATING FILM | INORGANIC | 0.2 | 59 | $2.8 \times 10^{-7}$ | 1.0 |
| 17 | SECOND INTERLAYER INSULATING FILM | INORGANIC | 0.1 | 228 | $5.6 \times 10^{-7}$ | 1.9 |
| 18 | FIRST INTERLAYER INSULATING FILM | INORGANIC | 0.05 | 59 | $7.3 \times 10^{-8}$ | 0.2 |
| 19 | SECOND GATE ELECTRODE LAYER | INORGANIC | 0.3 | 120 | $9.1 \times 10^{-7}$ | 3.1 |
| 20 | FIRST GATE ELECTRODE LAYER | INORGANIC | 0.05 | 120 | $1.6 \times 10^{-7}$ | 0.5 |
| 21 | GATE INSULATING FILM | INORGANIC | 0.05 | 59 | $7.7 \times 10^{-8}$ | 0.3 |
| 22 | SECOND BASE COAT FILM | INORGANIC | 0.1 | 59 | $1.6 \times 10^{-7}$ | 0.5 |
| 23 | FIRST BASE COAT FILM | INORGANIC | 0.05 | 133 | $1.8 \times 10^{-7}$ | 0.6 |
| 24 | RESIN SUBSTRATE LAYER | ORGANIC | 10 | 2 | $9.3 \times 10^{-7}$ | 3.1 |

| TEST EXAMPLE | RADIUS OF CREASE $r_c$ [mm] | INORGANIC RIGIDITY RATE |
|---|---|---|
| 13 | 156 | 0.91 |
| 14 | 22 | 0.08 |
| 15 | 42 | 0.63 |
| 16 | 56 | 0.69 |
| 17 | 77 | 0.81 |
| 18 | 101 | 0.83 |
| 19 | 101 | 0.83 |
| 20 | 25 | 0.29 |
| 21 | 48 | 0.60 |
| 22 | 66 | 0.77 |
| 23 | 101 | 0.80 |
| 24 | 85 | 0.79 |

FIG.20

| No. | | MATERIAL | THICKNESS [μm] | MODULUS OF ELASTICITY [GPa] | $E_i I_i$ [Pa·m⁴] | $E_i I_i / \Sigma E_i I_i \times 100$ [%] |
|---|---|---|---|---|---|---|
| 1 | HARD COAT | INORGANIC | 4.7 | 81 | $2.5 \times 10^{-5}$ | 44 |
| 2 | COLOR FILTER SUBSTRATE | ORGANIC | 12 | 4.64 | $1.7 \times 10^{-6}$ | 3.0 |
| 3 | SECOND MOISTURE-PROOF LAYER | INORGANIC | 0.5 | 228 | $1.4 \times 10^{-6}$ | 2.4 |
| 4 | TOUCH PANEL'S SECOND INTERCONNECTING LAYER | INORGANIC | 0.1 | 120 | $1.4 \times 10^{-7}$ | 0.2 |
| 5 | TOUCH PANEL SUBSTRATE | ORGANIC | 16 | 4.65 | $2.1 \times 10^{-7}$ | 0.4 |
| 6 | TOUCH PANEL'S FIRST INTERCONNECTING LAYER | INORGANIC | 0.1 | 120 | $3.4 \times 10^{-8}$ | 0.1 |
| 7 | COLOR FILTER | ORGANIC | 5 | 2.22 | $7.1 \times 10^{-8}$ | 0.1 |
| 8 | FIRST MOISTURE-PROOF LAYER | INORGANIC | 0.1 | 228 | $2.5 \times 10^{-7}$ | 0.4 |
| 9 | FILLING LAYER | ORGANIC | 6 | 4.41 | $4.9 \times 10^{-7}$ | 0.9 |
| 10 | SEALING FILM | INORGANIC | 3.5 | 81 | $9.4 \times 10^{-6}$ | 16.5 |
| 11 | ORGANIC EL LAYER | ORGANIC | 0.5 | 0 | – | 0.0 |
| 12 | SECOND PROTECTIVE INSULATING FILM | ORGANIC | 5 | 4.7 | $1.2 \times 10^{-6}$ | 2.2 |
| 13 | FIRST PROTECTIVE INSULATING FILM | INORGANIC | 0.15 | 228 | $2.2 \times 10^{-6}$ | 3.9 |
| 14 | THIRD INTERLAYER INSULATING FILM | INORGANIC | 0.2 | 59 | $7.8 \times 10^{-7}$ | 1.4 |
| 15 | SECOND INTERLAYER INSULATING FILM | INORGANIC | 0.1 | 228 | $1.5 \times 10^{-6}$ | 2.7 |
| 16 | FIRST INTERLAYER INSULATING FILM | INORGANIC | 0.05 | 59 | $2.0 \times 10^{-7}$ | 0.3 |
| 17 | SECOND GATE ELECTRODE LAYER | INORGANIC | 0.3 | 120 | $2.5 \times 10^{-6}$ | 4.3 |
| 18 | FIRST GATE ELECTRODE LAYER | INORGANIC | 0.05 | 120 | $4.1 \times 10^{-7}$ | 0.7 |
| 19 | GATE INSULATING FILM | INORGANIC | 0.05 | 59 | $2.0 \times 10^{-7}$ | 0.4 |
| 20 | SECOND BASE COAT FILM | INORGANIC | 0.1 | 29 | $4.1 \times 10^{-7}$ | 0.7 |
| 21 | FIRST BASE COAT FILM | INORGANIC | 0.05 | 133 | $4.7 \times 10^{-7}$ | 0.8 |
| 22 | RESIN SUBSTRATE LAYER | ORGANIC | 12 | 6.51 | $8.4 \times 10^{-6}$ | 14.6 |

| TEST EXAMPLE | RADIUS OF CREASE $r_c$ [mm] | INORGANIC RIGIDITY RATE |
|---|---|---|
| 25 | 107 | 0.79 |
| 26 | 31 | 0.35 |
| 27 | 58 | 0.73 |
| 28 | 68 | 0.73 |
| 29 | 116 | 0.87 |
| 30 | 115 | 0.84 |
| 31 | 149 | 0.87 |
| 32 | 57 | 0.64 |
| 33 | 93 | 0.83 |
| 34 | 157 | 0.91 |
| 35 | 90 | 0.76 |

FIG.24

| No. | | MATERIAL | THICKNESS [$\mu$m] | MODULUS OF ELASTICITY [GPa] | $E_i I_i$ [Pa·m$^4$] | $E_i I_i / \Sigma E_i I_i$ × 100[%] |
|---|---|---|---|---|---|---|
| 1 | HARD COAT | INORGANIC | 1.5 | 228 | $4.5 \times 10^{-6}$ | 46.6 |
| 2 | TOUCH PANEL'S SECOND INTERCONNECTING LAYER | INORGANIC | 0.1 | 120 | $1.4 \times 10^{-7}$ | 1.4 |
| 3 | TOUCH PANEL SUBSTRATE | ORGANIC | 5 | 4.7 | $1.6 \times 10^{-7}$ | 1.7 |
| 4 | TOUCH PANEL'S FIRST INTERCONNECTING LAYER | INORGANIC | 0.1 | 120 | $3.8 \times 10^{-8}$ | 0.4 |
| 5 | COLOR FILTER | ORGANIC | 5 | 2.22 | $1.3 \times 10^{-8}$ | 0.1 |
| 6 | MOISTURE-PROOF LAYER | INORGANIC | 0.1 | 228 | $5.6 \times 10^{-10}$ | 0.0 |
| 7 | FILLING LAYER | ORGANIC | 6 | 4.41 | $2.5 \times 10^{-8}$ | 0.3 |
| 8 | SEALING FILM | INORGANIC | 3.5 | 81 | $1.5 \times 10^{-6}$ | 15.9 |
| 9 | ORGANIC EL LAYER | ORGANIC | 0.5 | 0 | – | 0.0 |
| 10 | SECOND PROTECTIVE INSULATING FILM | ORGANIC | 5 | 4.7 | $3.5 \times 10^{-7}$ | 3.6 |
| 11 | FIRST PROTECTIVE INSULATING FILM | INORGANIC | 0.15 | 228 | $7.3 \times 10^{-7}$ | 7.5 |
| 12 | THIRD INTERLAYER INSULATING FILM | INORGANIC | 0.2 | 59 | $2.6 \times 10^{-7}$ | 2.7 |
| 13 | SECOND INTERLAYER INSULATING FILM | INORGANIC | 0.1 | 228 | $5.1 \times 10^{-7}$ | 5.3 |
| 14 | FIRST INTERLAYER INSULATING FILM | INORGANIC | 0.05 | 59 | $6.7 \times 10^{-8}$ | 0.7 |
| 15 | SECOND GATE ELECTRODE LAYER | INORGANIC | 0.3 | 120 | $8.3 \times 10^{-7}$ | 8.6 |
| 16 | FIRST GATE ELECTRODE LAYER | INORGANIC | 0.05 | 120 | $1.4 \times 10^{-7}$ | 1.5 |
| 17 | GATE INSULATING FILM | INORGANIC | 0.05 | 59 | $7.0 \times 10^{-8}$ | 0.7 |
| 18 | SECOND BASE COAT FILM | INORGANIC | 0.1 | 59 | $1.4 \times 10^{-7}$ | 1.5 |
| 19 | FIRST BASE COAT FILM | INORGANIC | 0.05 | 133 | $1.6 \times 10^{-7}$ | 1.7 |

| TEST EXAMPLE | RADIUS OF CREASE $r_c$ [mm] | INORGANIC RIGIDITY RATE |
|---|---|---|
| 36 | 186 | 0.94 |
| 37 | 40 | 0.61 |
| 38 | 105 | 0.88 |
| 39 | 111 | 0.89 |
| 40 | 132 | 0.89 |
| 41 | 145 | 0.93 |
| 42 | 163 | 0.94 |
| 43 | 101 | 0.88 |
| 44 | 91 | 0.84 |
| 45 | 155 | 0.93 |
| 46 | 168 | 0.94 |

| RADIUS OF BEND [mm] | SUBJECTIVE EVALUATION | | | RATE OF PERMISSIBILITY |
|---|---|---|---|---|
| | NUMBER OF TESTERS | | | |
| | LEVEL 1: INCONSPICUOUS | LEVEL 2: PERMISSIBLE | LEVEL 3: IMPERMISSIBLE | |
| 138 | 22 | 0 | 0 | 100% |
| 112 | 15 | 7 | 0 | 100% |
| 102 | 4 | 18 | 0 | 100% |
| 83 | 2 | 17 | 3 | 86% |
| 65 | 0 | 2 | 20 | 9% |
| 60 | 0 | 0 | 22 | 0% |
| 30 | 0 | 0 | 22 | 0% |

ORGANIC EL DISPLAY DEVICE

TECHNICAL FIELD

The present invention relates to an organic EL display device.

BACKGROUND ART

Self-luminous organic EL display devices including an organic electroluminescence (EL) element have recently received attention, as display devices alternative to liquid crystal display devices. As an organic EL display device of this type, a repeatedly bendable organic EL display device including a flexible resin substrate, and an organic EL element and various films stacked on the resin substrate has been proposed.

For example, Patent Document 1 discloses a display device including a flexible display member and a support member having a shape memory function and provided on the back face of the display member. This display device uses heat generated within the display device to eliminate warpage or unevenness which is caused after the display device has been folded.

CITATION LIST

Patent Documents

Patent Document 1: Japanese Unexamined Patent Publication No. 2013-210491

SUMMARY OF THE INVENTION

Technical Problem

Even a repeatedly bendable organic EL display device may bear a mark of bend (hereinafter referred to as a "crease") on its bendable portion if the organic EL display device has been left folded while having the bendable portion bent in a U-shape. Such a crease is visually recognized as unevenness on the display screen of the organic EL display device, deteriorating the quality of appearance.

In view of the above problems, it is therefore an object of the present invention to make a crease on an organic EL display device inconspicuous.

Solution to the Problem

To achieve the above object, the present invention is directed to an organic EL display device including: a plurality of organic layers each made of an organic material and each having a predetermined modulus of elasticity and a predetermined thickness; and a plurality of inorganic layers each made of an inorganic material and each having a predetermined modulus of elasticity and a predetermined thickness. The plurality of organic layers and the plurality of inorganic layers are stacked together to constitute a device body which forms the organic EL display device. A quotient obtained by dividing a sum of flexural rigidities of the plurality of inorganic layers by a sum total of a sum of flexural rigidities of the plurality of organic layers and the sum of the flexural rigidities of the plurality of inorganic layers is 0.78 or higher and 1 or lower.

Advantages of the Invention

According to the present invention, the quotient obtained by dividing the sum of the flexural rigidities of the plurality of inorganic layers by the sum total of the sum of the flexural rigidities of the plurality of organic layers and the sum of the flexural rigidities of the plurality of inorganic layers is 0.78 or higher and 1 or lower. This feature makes a radius of a crease on the organic EL display device likely to be 81 mm or larger, and can make the crease inconspicuous.

BRIEF DESCRIPTION OF THE DRAWINGS

FIG. 6 is a table showing details of Test Example 1 that was specifically tested, as an example of the organic EL display device according to the first embodiment of the present invention.

FIG. 10 is a table showing data of specific measurement of the radius of crease of the organic EL display device according to the first embodiment of the present invention.

FIG. 11 is a table showing conversion of the specific measurement data of the radius of crease of the organic EL display device according to the first embodiment of the present invention into curvatures of crease.

FIG. 16 is a table showing details of Test Example 13 that was specifically tested, as an example of the organic EL display device according to the second embodiment of the present invention.

FIG. 20 is a table showing details of Test Example 25 that was specifically tested, as an example of the organic EL display device according to the third embodiment of the present invention.

FIG. 24 is a table showing details of Test Example 36 that was specifically tested, as an example of the organic EL display device according to the fourth embodiment of the present invention.

DESCRIPTION OF EMBODIMENTS

Embodiments of the present invention will now be described in detail with reference to the drawings. Note that the present invention is not limited to the following embodiments.

First Embodiment

Figure 1:
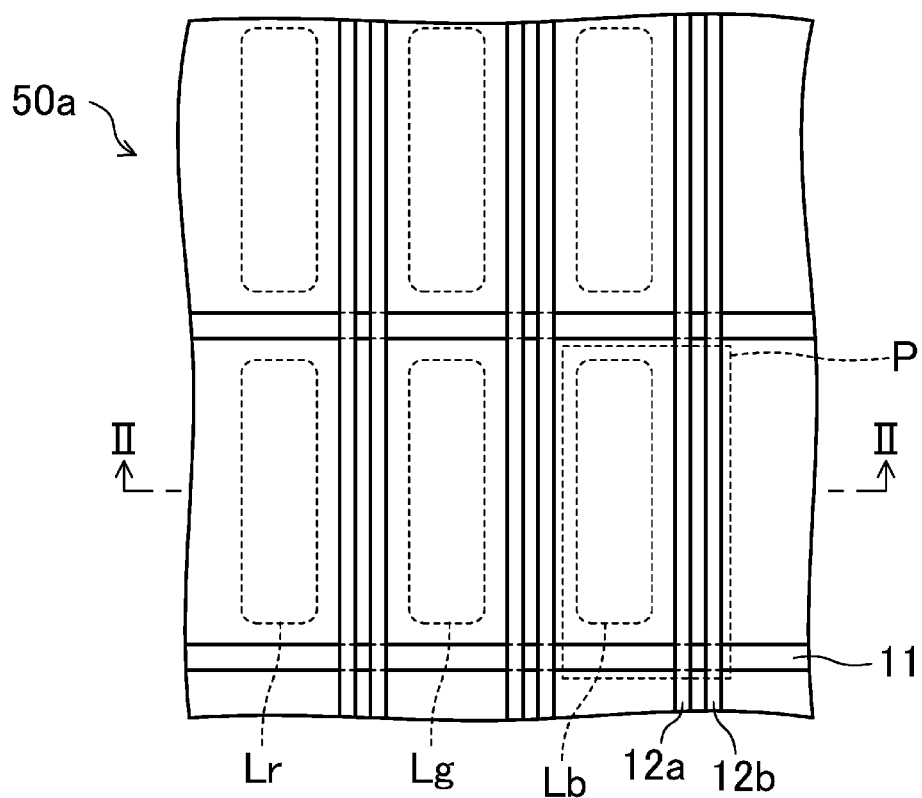
FIG. 1 is a plan view showing a pixel structure of an organic EL display device according to a first embodiment of the present invention.
Figure 2:
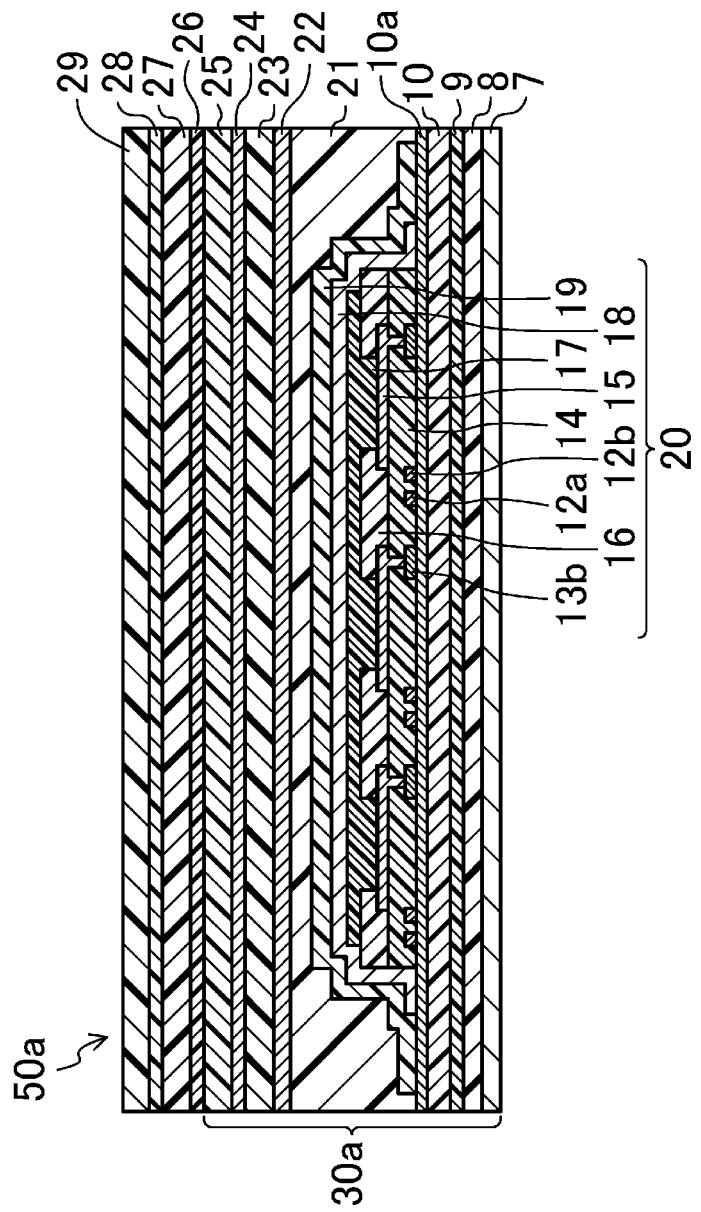
FIG. 2 is a cross-sectional view of the organic EL display device taken along line II-II shown in FIG. 1.
Figure 3:
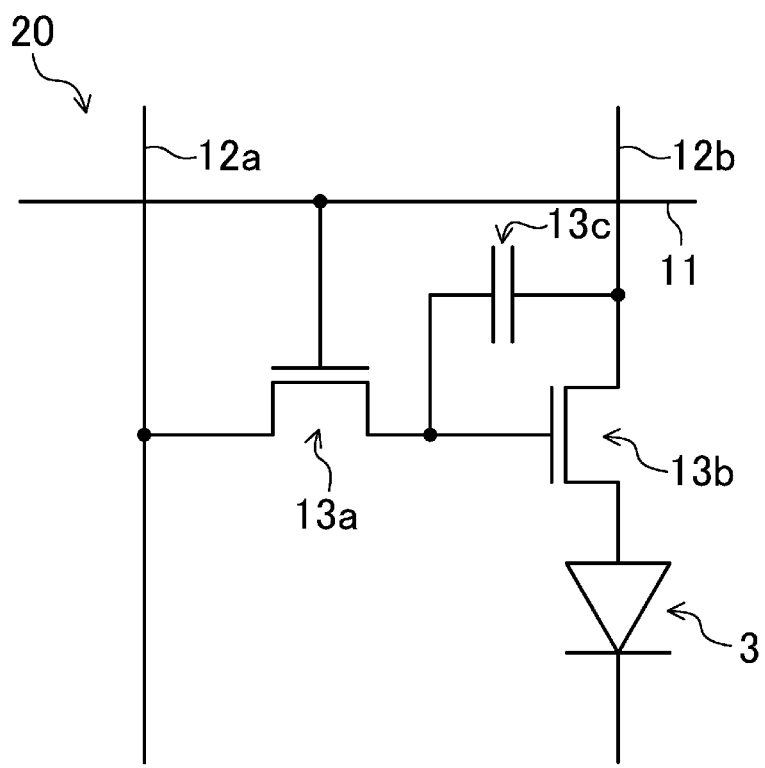
FIG. 3 is an equivalent circuit diagram of an organic EL element layer included in the organic EL display device according to the first embodiment of the present invention.
Figure 4:
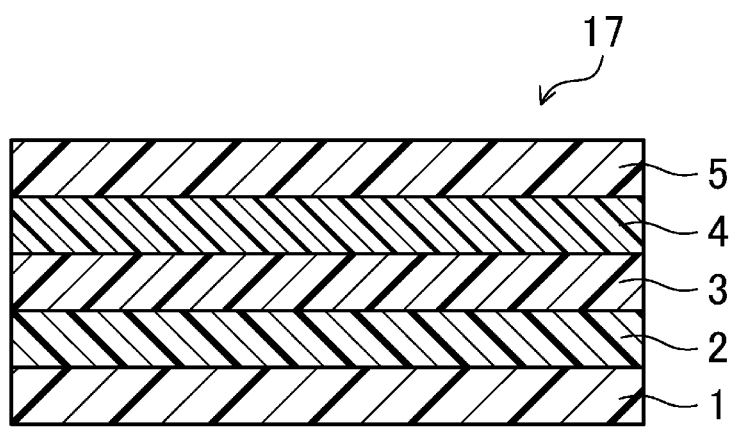
FIG. 4 is a cross-sectional view of the organic EL layer included in the organic EL display device according to the first embodiment of the present invention.

FIGS. 1 to 14 show an organic EL display device according to a first embodiment of the present invention. FIG. 1 is a plan view showing a pixel structure of the organic EL display device 50a of this embodiment. FIG. 2 is a cross-sectional view of the organic EL display device 50a, taken along line II-II in FIG. 1. FIG. 3 is an equivalent circuit diagram of an organic EL element layer 20 included in the organic EL display device 50a. FIG. 4 is a cross-sectional view of an organic EL layer 17 included in the organic EL display device 50a.

As shown in FIG. 2, the organic EL display device 50a includes: an organic EL display panel 30a; a touch panel 27 provided over the organic EL display panel 30a with a (second) adhesive layer 26 interposed therebetween; and a hard coat 29 provided over the touch panel 27 with a (third) adhesive layer 28 interposed therebetween. Here, a display region (not shown) of the organic EL display device 50a includes a plurality of sub-pixels P arranged in a matrix as shown in FIG. 1. As shown in FIG. 1, a sub-pixel P having a red light emission region Lr for displaying gradation of a red color, a sub-pixel P having a green light emission region Lg for displaying gradation of a green color, and a sub-pixel P having a blue light emission region Lb for displaying gradation of a blue color are placed next to one another in the display region of the organic EL display panel 50a. Note that in the display region of the organic EL display device 50a, the three adjacent sub-pixels P each having one of the red light emission region Lr, the green light emission region Lg, and the blue light emission region Lb constitute one pixel.

As shown in FIG. 2, the organic EL display panel 30a includes a resin substrate layer 10, a stress adjusting layer 8, a rigidifying layer 7, an organic EL element layer 20, a color filter 23, and a color filter substrate 25. The stress adjusting layer 8 and the rigidifying layer 7 are provided in this order adjacent to a back face (lower surface in FIG. 2) of the resin substrate layer 10. The organic EL element layer 20, the color filter 23, and the color filter substrate 25 are provided in this order over a surface (upper surface in FIG. 2) of the resin substrate layer 10.

The resin substrate layer 10 is made of, for example, a polyimide resin or the like (in the below-mentioned Test Example 1 described later, a polyimide resin is adopted).

The stress adjusting layer 8 is configured to control the position of a neutral plane N (see FIG. 5) which is subjected to neither compression nor tension and in which substantially no bending stress is generated when the organic EL display device 50a is bent. The stress adjusting layer 8 has relatively high flexural rigidity. Here, the stress adjusting layer 8 is constituted of a plastic film made of, for example, polyethylene terephthalate, polyethylene naphthalate, aramid, (meth)acrylate, triacetylcellulose, or the like (in the below-mentioned Test Example 1, polyethylene terephthalate is adopted). A first adhesive layer 9 is provided between the stress adjusting layer 8 and the resin substrate layer 10. The first adhesive layer 9 is made of, for example, a photo-curable adhesive sheet, a UV-curable adhesive, a thermosetting adhesive, an epoxy adhesive, a cyanoacrylate instant adhesive, or the like (in the below-mentioned Test Example 1, a UV-curable acrylic resin is adopted).

As shown in FIG. 2, the rigidifying layer 7 is provided on the stress adjusting layer 8 (in FIG. 2, on the lower surface of a device body) for the purpose of increasing the rigidity of the organic EL display device 50a. The rigidifying layer 7 is constituted of, for example, an inorganic insulating film such as a silicon nitride film or any other suitable material (in the below-mentioned Test Example 1, a silicon nitride film is adopted).

As shown in FIG. 3, the organic EL element layer 20 includes a plurality of gate lines 11, a plurality of source lines 12a, and a plurality of power supply lines 12b. The gate lines 11 are provided over the resin substrate layer 10 (see FIG. 2) to extend parallel to one another in a lateral direction in FIG. 3. The source lines 12a are provided over the resin substrate layer 10 to extend parallel to one another in a longitudinal direction in FIG. 3. The power supply lines 12b are provided over the resin substrate layer 10 to be adjacent to the source lines 12a, respectively, and to extend parallel to one another. A base coat film 10a is provided between the resin substrate layer 10 and a gate layer forming the gate lines 11 and the like. The base coat film 10a is constituted of a single-layer film, such as a silicon nitride film, a silicon oxide film, a silicon oxynitride film, and the like, or a multilayer film including two or more of these films (in the below-mentioned Test Example 1, a multilayer film is adopted which includes a silicon oxide film provided as an upper layer and functioning as a second base coat film, and a silicon nitride film provided as a lower layer and functioning as a first base coat film).

As shown in FIG. 3, the organic EL element layer 20 further includes a plurality of first TFTs 13a each provided for an associated one of the sub-pixels P, a plurality of second TFTs 13b each provided for an associated one of the sub-pixels P, and a plurality of capacitors 13c each provided for an associated one of the sub-pixels P. Here, each of the first TFTs 13a is connected to an associated one of the gate lines 11 and an associated one of the source lines 12a as shown in FIG. 3. Each of the second TFTs 13b is connected to an associated one of the first TFTs 13a and an associated one of the power supply lines 12b as shown in FIG. 3. Here, the first TFTs 13a and the second TFTs 13b include, for example: a semiconductor layer having an island shape and provided on the base coat film 10a; a gate insulating film covering the semiconductor layer; a gate electrode provided on the gate insulating film and overlapping with a portion of the semiconductor layer; an interlayer insulating film covering the gate electrode; and a source electrode and a drain electrode spaced apart from each other on the interlayer insulating film. Each of the capacitors 13c is connected to an associated one of the first TFTs 13a and an associated one of the power supply lines 12b as shown in FIG. 3. The capacitors 13c each include, for example, a pair of electrodes and an interlayer insulating film. One of the pair of electrodes is made of the same material as the gate lines 11, and is formed in the same layer as the gate line 11. The other of the pair of electrodes is made of the same material as the source lines 12a, and is formed in the same layer as the source lines 12a. The interlayer insulating film is provided between the pair of electrodes. The gate insulating film is constituted of a single-layer film, such as a silicon nitride film, a silicon oxide film, a silicon oxynitride film, and the like, or a multilayer film of two or more of these films (in the below-mentioned Test Example 1, a single-layer silicon oxide film is adopted). The gate electrode is constituted of, for example, a single-layer conductive metal film or a multilayer conductive metal film (in the below-mentioned Test Example 1, a multilayer film is adopted which includes a tungsten film provided as an upper layer and functioning as a second gate electrode layer, and a tantalum nitride film provided as a lower layer and functioning as a first gate electrode layer). The interlayer insulating film is constituted of a single-layer film, such as a silicon nitride film, a silicon oxide film, a silicon oxynitride film, and the like, or a multilayer film including two or more of these films (in the below-mentioned Test Example 1, a multilayer film is adopted which includes a silicon oxide film provided as an upper layer and functioning as a third interlayer insulating film, a silicon nitride film provided as an intermediate layer and functioning as a second interlayer insulating film, and a silicon oxide film provided as a lower layer and functioning as a first interlayer insulating film). Note that the first and second TFTs 13a and 13b configured as top gate TFTs in this embodiment may be configured as bottom gate TFTs.

As shown in FIG. 2, the organic EL element layer 20 further includes a protective insulating film 14, and a plurality of first electrodes 15 provided, as anode electrodes, on the protective insulating film 14. The protective insulating film 14 substantially covers the first TFTs 13a (see FIG. 3), the second TFTs 13b, and the capacitors 13c (see FIG. 3). The first electrodes 15 are each provided for an associated one of the sub-pixels P, and are each connected to an associated one of the second TFTs 13b. Here, as shown in FIG. 2, the protective insulating film 14 covers each second TFT 13b, except for a portion of the drain electrode of the second TFT 13b. The protective insulting film 14 includes a first protective insulating film and a second protective insulating film. The first protective insulating film is constituted of a single-layer film, such as a silicon nitride film, a silicon oxide film, a silicon oxynitride film, and the like, or a multilayer film including two or more of these films (in the below-mentioned Test Example 1, a single-layer silicon nitride film is adopted). The second protective insulating film is made of, for example, a photosensitive acrylic resin, a photosensitive polyimide resin, a photosensitive polysiloxane resin, or the like (in the below-mentioned Test Example 1, a photosensitive acrylic resin is adopted). The first electrodes 15 are arranged in a matrix on the interlayer insulating film 14 such that each first electrode 15 corresponds to an associated one of the sub-pixels P. As shown in FIG. 2, the first electrode 15 of each sub-pixel P is connected to the drain electrode of an associated one of the second TFTs 13b via an associated one of contact holes formed in the protective insulating film 14. The first electrodes 15 function to inject holes (positive holes) into an organic EL layer 17 described below. To increase the efficiency in injecting positive holes into the organic EL layer 17, the first electrodes 15 are preferably made of a material having a high work function. Examples of materials for the first electrodes 15 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and the like. The first electrodes 15 may also be made of an alloy of, for example, magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), lithium fluoride (LiF)/calcium (Ca)/aluminum (Al), or the like. Furthermore, the material for the first electrodes 15 may also be a conductive oxide such as tin oxide (SnO), zinc oxide (ZnO), indium tin oxide (ITO), indium zinc oxide (IZO), and the like, for example. Moreover, the first electrodes 15 may be multilayers containing the above materials, such as ITO/Ag, IZO/Ag, and IZO/Al. Examples of the materials having a high work function, out of conductive oxides and the like, include indium tin oxide (ITO), indium zinc oxide (IZO), and the like.

As shown in FIG. 2, the organic EL element layer 20 further includes an edge cover 16 formed in a grid pattern to cover peripheral portions of the first electrodes 15, and the organic EL layer 17 covering portions of the first electrodes 15 exposed from the edge cover 16. Examples of materials for the edge cover 16 include an inorganic film of silicon dioxide ($SiO_2$), silicon nitride (SiNx, where x is a positive number) such as trisilicon tetranitride ($Si_3N_4$), silicon oxynitride (SiNO), or the like, and an organic film of a (photosensitive) polyimide resin, a (photosensitive) acrylic resin, a (photosensitive) polysiloxane resin, a novolak resin, or the like. As shown in FIG. 4, the organic EL layer 17 includes a positive hole injection layer 1, a positive hole transport layer 2, a light-emitting layer 3, an electron transport layer 4, and an electron injection layer 5, which are provided on the first electrodes 15 in this order.

The positive hole injection layer 1 is also called an anode buffer layer, and functions to bring the energy levels of the first electrodes 15 and the organic EL layer 17 closer to each other and increase efficiency in injecting positive holes from the first electrodes 15 into the organic EL layer 17. Here, non-limiting examples of materials for the positive hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like.

The positive hole transport layer 2 functions to increase efficiency in transporting positive holes from the first electrodes 15 to the organic EL layer 17. Here, non-limiting examples of materials for the positive hole transport layer 2 include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

When a voltage is applied from the first electrodes 15 and a second electrode 18 described below, positive holes and electrons are injected from the first electrodes 15 and the second electrode 18 into the light-emitting layer 3, in which the positive holes and the electrons are recombined with each other. The light-emitting layer 3 is made of a material having high luminous efficiency. Non-limiting examples of materials for the light-emitting layer 3 include metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, polysilane, and the like.

The electron transport layer 4 functions to efficiently move electrons to the light-emitting layer 3. Here, non-limiting examples of materials for the electron transport layer 4 includes, as organic compounds, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds, and the like.

The electron injection layer 5 functions to bring the energy levels of the second electrode 18 and the organic EL layer 17 closer to each other and increase efficiency in injecting electron from the second electrode 18 into the organic EL layer 17. This function contributes to decrease in the drive voltage of the organic EL element layer 20. The electron injection layer 5 may also be called a cathode buffer layer. Here, non-limiting examples of materials for the electron injection layer 5 include inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), strontium oxide (SrO), and the like.

As shown in FIG. 2, the organic EL element layer 20 further includes the second electrode 18 provided as a cathode electrode to cover the organic EL layer 17 and the edge cover 16, and a sealing film 19 covering the second electrode 18. Here, the second electrode 18 functions to inject electrons into the organic EL layers 17. To increase the efficiency in injecting electrons into the organic EL layer 17, the second electrodes 18 are preferably made of a material having a low work function. Non-limiting examples of materials for the second electrode 18 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and the like. The second electrode 18 may also be made of, for example, an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), lithium fluoride (LiF)/calcium (Ca)/aluminum (Al), or the like. The second electrode 18 may also be made of, for example, a conductive oxide such as tin oxide (SnO), zinc oxide (ZnO), indium tin oxide (ITO), indium zinc oxide (IZO), and the like. Moreover, the second electrode 18 may be multilayers containing the above materials, such as ITO/Ag. Examples of materials having a low work function include magnesium (Mg), lithium (Li), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like. The sealing film 19 functions to protect the organic EL layer 17 against moisture and oxygen. Examples of materials for the sealing film 19 include inorganic materials such as silicon dioxide ($SiO_2$), aluminum oxide ($Al_2O_3$), silicon nitride (SiNx, where x is a positive number) such as trisilicon tetranitride ($Si_3N_4$), silicon carbonitride (SiCN), and the like, and organic materials such as acrylate, polyurea, parylene, polyimide, polyamide, and the like (in the below-mentioned Test Example 1, silicon nitride is adopted).

The color filter 23 includes, for example, a black matrix layer formed in a grid pattern, a plurality of color resist layers, such as a red layer, a green layer, and a blue layer, each corresponding to one of sub-pixels P, and an overcoat layer covering the black matrix layer and the color resist layers. The color filter 23 is made of, for example, a photosensitive acrylic resin or the like (in the below-mentioned Test Example 1, a photosensitive acrylic resin is adopted.) As shown in FIG. 2, the color filter 23 is provided over the color filter substrate 25 (in FIG. 2, below the color filter substrate 25) with a (second) moisture-proof layer 24 interposed therebetween. As shown in FIG. 2, a (first)

moisture-proof layer 22 is provided on a surface (a lower surface in FIG. 2) of the color filter 23. The first and second moisture-proof layers 22 and 24 are each constituted of an inorganic insulating film such as a single-layer silicon nitride film, a single-layer silicon oxide film, or a single-layer silicon oxynitride film, or a multilayer film including two or more of these films (in the below-mentioned Test Example 1, a single-layer silicon nitride film is adopted for each of the moisture-proof layers). The color filter substrate 25 is made of, for example, a polyimide resin, a polyethylene terephthalate resin, a polyethylene naphthalate resin, an aramid resin, a (meth)acrylate resin, or the like (in the below-mentioned Test Example 1, a polyimide resin is adopted). As shown in FIG. 2, a filling layer 21 is provided between the organic EL element layer 20 and the first moisture-proof layer 22. The filling layer 21 is made of, for example, a UV-curable epoxy resin or the like (in the below-mentioned Test Example 1, a UV-curable epoxy resin is adopted).

The touch panel 27 includes, for example, a touch panel substrate, a touch panel's first interconnecting layer provided on the back face of the touch panel substrate, and a touch panel's second interconnecting layer provided on the front face of the touch panel substrate. Thus, the touch panel 27 has a projected capacitive structure. The touch panel substrate is made of, for example, a polyimide resin, a polyethylene terephthalate resin, a polyethylene naphthalate resin, an aramid resin, a (meth)acrylate resin, or the like (in the below-mentioned Test Example 1, a polyimide resin is adopted). The touch panel's first interconnecting layer and the touch panel's second interconnecting layer are each made of a metal film of, for example, copper or the like (in the below-mentioned Test Example 1, copper is adopted). As shown in FIG. 2, a second adhesive layer 26 is provided between the color filter substrate 25 and the touch panel 27. The second adhesive layer 26 is made of, for example, a photo-curable adhesive sheet, a UV-curable adhesive, a thermosetting adhesive, an epoxy adhesive, or a cyanoacrylate instant adhesive (in the below-mentioned Test Example 1, a UV-curable acrylic resin is adopted).

The hard coat 29 includes a hard coat substrate and a hard coat layer provided on the hard coat substrate. The hard coat substrate is constituted of a plastic film made of, for example, polyimide, polyethylene terephthalate, polyethylene naphthalate, aramid, (meth)acrylate, or the like (in the below-mentioned Test Example 1, polyethylene terephthalate is adopted). The hard coat layer is made of, for example, a UV-curable organosilicon resin, a thermosetting resin, an acrylic resin, a urethane resin, a polysiloxane resin, an inorganic insulating film, or the like (in the below-mentioned Test Example 1, a silicon nitride film is adopted). As shown in FIG. 2, a third adhesive layer 28 is provided between the touch panel 27 and the hard coat 29. The third adhesive layer 28 is made of, for example, a photo-curable adhesive sheet, a UV-curable adhesive, a thermosetting adhesive, an epoxy adhesive, a cyanoacrylate instant adhesive, or the like (in the below-mentioned Test Example 1, a UV-curable acrylic resin is adopted).

The organic EL display device 50a having the configuration described above operates in the following manner. Specifically, in each of the sub-pixels P, a gate signal is input through the gate line 11 to the first TFT 13a to turn the first TFT 13a on, a predetermined voltage corresponding to a source signal is written through the source line 12a into the gate electrode of the second TFT 13b and the capacitor 13c, and the magnitude of a current from the power supply line 12b is determined based on the gate voltage of the second TFT 13b. The determined current is supplied to the light-emitting layer 3 so that the light-emitting layer 3 emits light, thereby displaying an image. In the organic EL display device 50a, even if the first TFT 13a is turned off, the gate voltage of the second TFT 13b is retained by the capacitor 13c. Thus, the light-emitting layer 3 keeps emitting light until a gate signal of a subsequent frame is received.

The organic EL display device 50a can be fabricated in the following manner, for example.

First, the organic EL element layer 20 is formed, by a known method, on a surface of the resin substrate layer 10 previously formed on a glass substrate, thereby preparing an element substrate. The second moisture-proof layer 24, the color filter 23, and the first moisture-proof layer 22 are formed, by a known method, on the color filter substrate 25 previously formed on another glass substrate, thereby preparing a CF substrate. Next, the element substrate and the CF substrate are bonded together via the filling layer 21. The glass substrate on the CF substrate is then removed by, for example, laser irradiation or the like. The second adhesive layer 26, the hard coat 29, and other layers to be interposed therebetween are stacked, as appropriate, over the back face of the color filter substrate 25 from which the glass substrate has been removed. Further, the glass substrate on the element substrate is removed by, for example, laser irradiation or the like. The first adhesive layer 9, the rigidifying layer 7, and other layers to be interposed therebetween are stacked, as appropriate, over the back face of the resin substrate layer 10 from which the glass substrate has been removed.

As described earlier, the organic EL display device 50a is comprised of the device body including the plurality of organic layers made of organic materials and the plurality of inorganic layers made of inorganic materials, the plurality of organic layers and the plurality of inorganic layers being stacked together. The organic layers include, for example, the stress adjusting layer 8, the first adhesive layer 9, the resin substrate layer 10, the second protective insulating film, a main portion of the organic EL layer 17, the filling layer 21, the color filter 23, the color filter substrate 25, the second adhesive layer 26, the touch panel substrate, the third adhesive layer 28, the hard coat substrate, and the like. The inorganic layers include, for example, the rigidifying layer 7, the base coat film 10a, the gate insulating film, the gate electrodes, the interlayer insulating film, the first protective insulating film, the sealing film 19, the first moisture-proof layer 22, the second moisture-proof layer 24, the touch panel's first interconnecting layer, the touch panel's second interconnecting layer, the hard coat layer, and the like.

Figure 5:
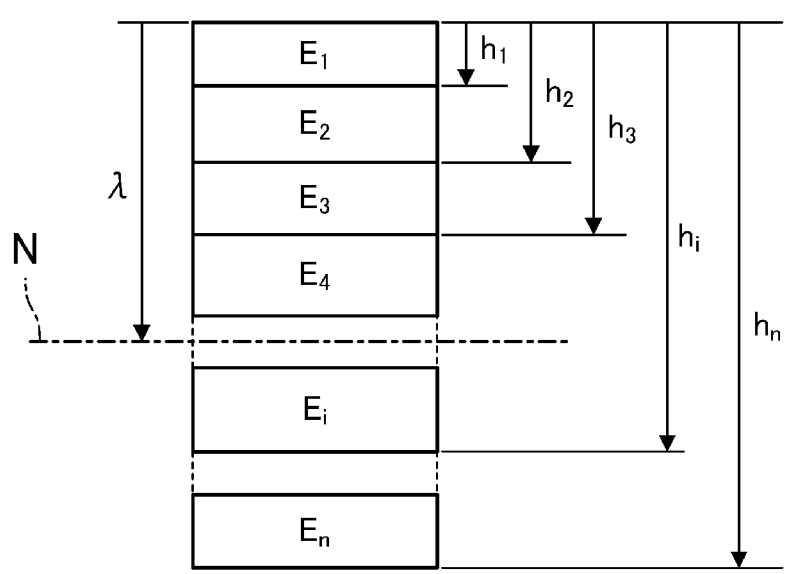
FIG. 5 is a schematic diagram illustrating a layered structure of the organic EL display device according to the first embodiment of the present invention.

As illustrated in FIG. 5, in the organic EL display device 50a, each of the organic layers and the inorganic layers forming the device body has a predetermined modulus of elasticity ($E_1$, $E_2$ ... $E_i$ ... $E_n$) and a predetermined thickness. FIG. 5 is a schematic diagram showing the multilayer structure of the organic EL display device 50a. In FIG. 5, $E_i$ (where i is a natural number from 1 to n) of each layer represents the modulus of elasticity of the layer; $h_i$ of each layer represents a distance from one of the surfaces (the upper surface in FIG. 5) of the organic EL display device 50a to a surface of the layer facing the other surface (the lower surface in FIG. 5) of the organic EL display device 50a (i.e., to the lower surface of the layer in FIG. 5); and λ represents a distance from the one of the surfaces (the upper surface in FIG. 5) of the organic EL display device 50a to the neutral plane N of the organic EL display device 50a.

Here, λ is calculated according to the following expression.

$$\lambda = \frac{\sum_{i=1}^{n} E_i(h_i^2 - h_{i-1}^2)}{2\sum_{i=1}^{n} E_i(h_i + h_{i-1})} \quad \text{[Exp. 1]}$$

Each layer has a flexural rigidity $E_iI_i$, which is defined by the multiplication product of a cross-sectional secondary moment $I_i$ of the layer and a modulus of elasticity $E_i$ of the material forming the layer. The flexural rigidity $E_iI_i$ is calculated according to the following expression.

$$E_iI_i = bE_i\{(h_i-\lambda)^3 - (h_{i-1}-\lambda)^3\}/3$$

In this expression, b (see FIG. 7 which will be described later) represents a width of the organic EL display device 50a, the width being parallel to a center axis A of a radius of bend (see FIG. 8 which will be described later) of the organic EL display device 50a.

As will be described later, in order to make a crease on the organic EL display device 50a have a radius of 100 mm or larger, the organic EL display device 50a is configured such that an inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower).

Figure 7:
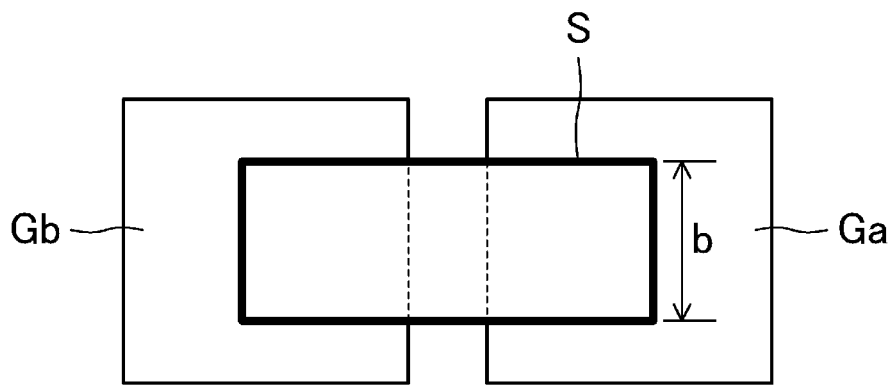
FIG. 7 is a first diagram illustrating a method of measuring a radius of a crease, the method having been specifically carried out for the organic EL display device according to the first embodiment of the present invention.
Figure 8:
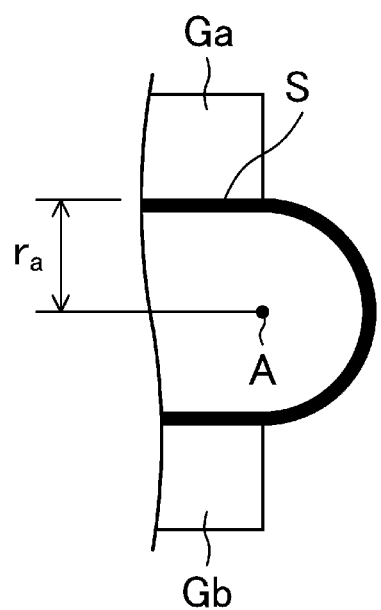
FIG. 8 is a second diagram illustrating the method of measuring the radius of the crease, the method having been specifically carried out for the organic EL display device according to the first embodiment of the present invention.
Figure 9:
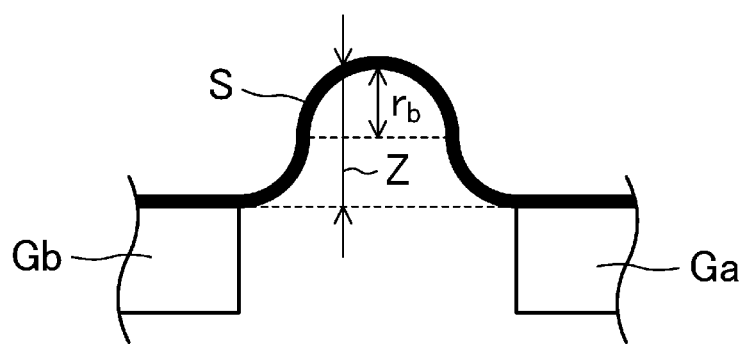
FIG. 9 is a third diagram illustrating the method of measuring the radius of the crease, the method having been specifically carried out for the organic EL display device according to the first embodiment of the present invention.
Figures 12, 13:
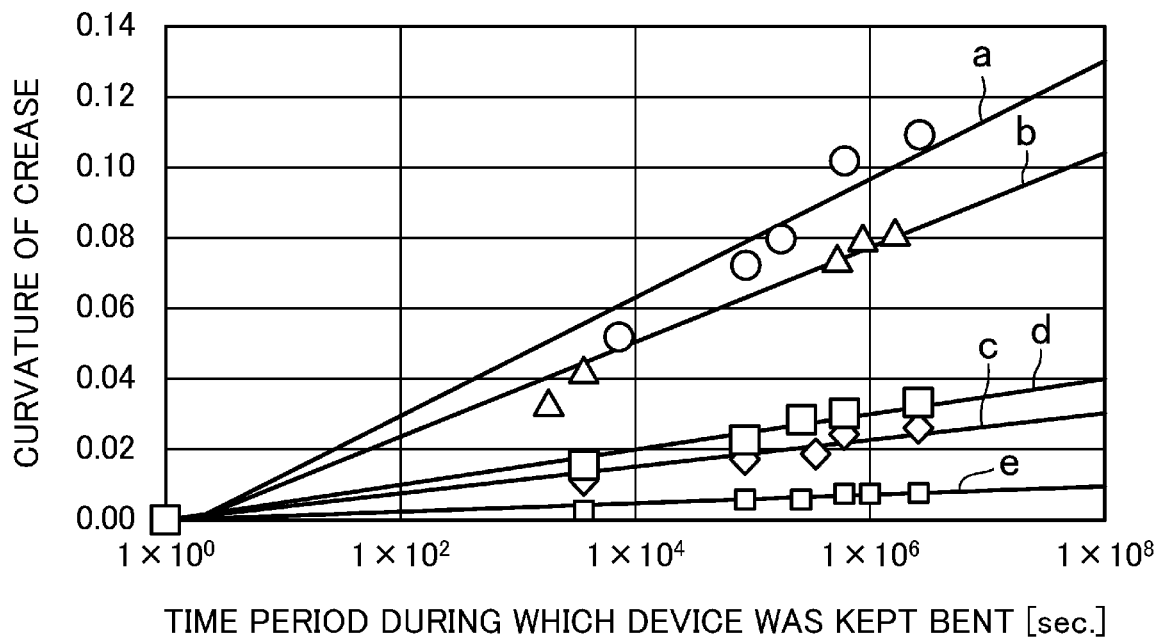
FIG. 12 is a graph showing a relationship between specific time periods during which the organic EL display device according to the first embodiment of the present invention was kept bent and the curvature of crease.
FIG. 13 is a table showing a radius of crease and an inorganic rigidity rate of each of Test Examples 1 to 12 that were specifically tested, as examples of the organic EL display device according to the first embodiment of the present invention.
Figure 14:
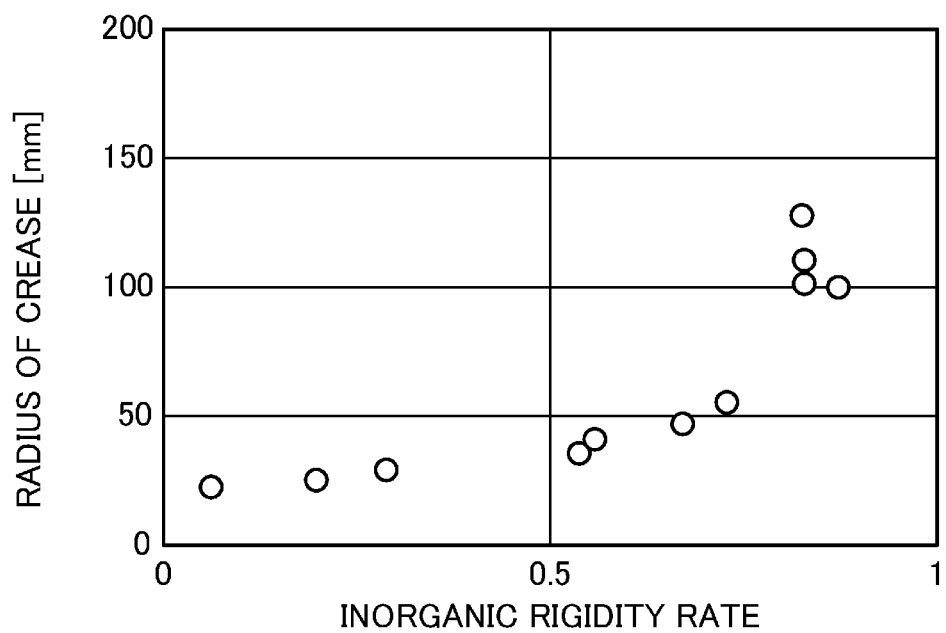
FIG. 14 is a graph showing a relationship between the inorganic rigidity rate and the radius of crease of Test Examples 1 to 12 that were specifically tested, as examples of the organic EL display device according to the first embodiment of the present invention.

Next, tests that were specifically conducted will be described with reference to FIGS. 6 to 15. FIG. 6 is a table showing the details of Test Example 1 that was specifically tested, as an example of the organic EL display device 50a. FIG. 7 illustrates a method of measuring a radius of crease $r_b$, the method specifically carried out for the organic EL display device 50a. Specifically, FIG. 7 shows a sample S before being bent, in plan view. FIG. 8 also illustrates the method of measuring the radius of crease $r_b$. Specifically, FIG. 8 shows the sample S in a bent state, as viewed from side. FIG. 9 also illustrates the method of measuring the radius of crease $r_b$. Specifically, FIG. 9 shows the sample S having the crease formed thereon, as viewed from side. FIG. 10 is a table showing data of the specific measurement of the radius of crease $r_b$ of the organic EL display device 50a. FIG. 11 is a table showing conversion of the data of the specific measurement of the radius of crease $r_b$ of the organic EL display device 50a into curvatures of crease. FIG. 12 is a graph showing a relationship between specific time periods during which the organic EL display device 50a was kept bent and the curvatures of the creases. FIG. 13 is a table showing a radius of crease and an inorganic rigidity rate of each of Test Examples 1 to 12 that were specifically tested, as examples of the organic EL display device 50a. FIG. 14 is a graph showing a relationship between the inorganic rigidity rate and the radius of crease of Test Examples 1 to 12.

As an example (Test Example 1) of this embodiment, an organic EL display device 50a (the sample S) having the configuration shown in the table of FIG. 6 and a size of 3.4 inches diagonal (b=52 mm) was prepared. In the table of FIG. 6, the values listed in the column of "$E_iI_i/\Sigma E_iI_i \times 100$" each indicate the proportion (%) of a flexural rigidity of the associated layer with respect to the sum total of flexural rigidities of the elements Nos. 1 to 28.

For the sample S prepared, a radius of crease $r_c$ was determined in the following manner.

First, as shown in FIG. 7 that is a plan view, the sample S was fixed, with an adhesive, to the surfaces of a pair of glass substrates Ga and Gb spaced apart from each other by 9.42 mm (corresponding to the product of a radius of bend $r_a \times \pi$, as will be described later).

Next, as shown in FIG. 8 that is a side view, a spacer having a thickness of 6 mm was placed between the pair of glass substrates Ga and Gb. The sample S was then kept bent around an axis A of bend at normal temperature and humidity (approximately at 24° C. and 47%) such that the radius of bend $r_a$ amounted to 3 mm.

The sample S was returned to the state shown in FIG. 7 at some points in time after when the sample S had started being kept bent: namely, 30 minutes later, 1 hour later, 1 day later, 3 days later, 1 week later, 2 weeks later, 1 month later, 3 months later, and so on. As shown in FIG. 9 that is a side view, using QuickVision (manufactured by Mitutoyo Corporation), the surface height (Z) of the sample S was measured continuously over a region from the glass substrate Ga to the glass substrate Gb, thereby determining a radius of bend mark (i.e., the radius of crease $r_b$) of the sample S at each of these points in time (see the table of FIG. 10). Samples "a" to "e" shown in the table of FIG. 10 are representative examples that were used to explain the method of determining the radius of crease. Here, the table of FIG. 10 shows that 1 second later, the radius of crease $r_b$ was 2000 mm. This value of 2000 mm was set for the purpose of correcting a measurement error in an initial stage, while the curvature of the crease at the same point in time was regarded to be substantially zero (0.0005).

Each radius of crease $r_b$ shown in the table of FIG. 10 was then converted into a curvature of crease ($1/r_b$) as shown in the table of FIG. 11. As a result, it has been found that there is a relationship as shown in FIG. 12 between the time period (X) during which each sample was kept bent and the curvature (Y) of crease. An approximate expression was obtained for each of the samples "a" to "e" (namely, a: Y=0.0073 ln X−0.0044, b: Y=0.0058 ln X−0.0035, c: Y=0.0022 ln X−0.0009, d: Y=0.0017 ln X−0.0008, and e: Y=0.0005 ln X−0.0003). Then, X=1×10⁸ (seconds later) was substituted in each approximate expression to obtain the curvature (Y), the reciprocal of which was defined as a radius of crease $r_c$ which would be observed approximately 3 years later.

An indentation elasticity modulus was measured for each layer using FISCHERSCOPE H100C (manufactured by FISCHER INSTRUMENTS K.K.), thereby obtained the modulus of elasticity (indentation elasticity modulus) of each layer. For the measurement, each organic layer was formed on a glass substrate so as to have a thickness approximately from 5 μm to 10 μm. The measurement was conducted under load control at an indentation speed of 2 mN/sec. A condition under which the maximum indentation ranged from 0.1 μm to 1 μm and the underlayer has a small influence was adopted. Each inorganic layer was formed on a silicon substrate so as to have a thickness approximately from 0.5 μm to 1 μm. The measurement was conducted under load control at an indentation speed of 2 mN/sec. A condition under which the maximum indentation ranged from 0.1 μm to 0.3 μm and the underlayer has a small influence was adopted. The modulus of elasticity of each of the metal layers included in the inorganic layers was fixedly determined as 120 GPa since the metal layer, which was thin and patterned, was deemed to have a small influence on the entire device.

As shown in the table of FIG. 13, Test Example 1 had an inorganic rigidity rate of 0.87 and a radius of crease $r_c$ of 100 mm.

Likewise, organic EL display devices of Test Examples 2 to 12 were each prepared under the following conditions, and an inorganic rigidity rate and a radius of crease $r_c$ were determined for each test example. In the following description of each of Test Examples, differences from Test Example 1 will be described.

Test Example 2

Test Example 2 differed from Test Example 1 in that: the hard coat layer was constituted of a UV-curable nanosilica-silane-acrylate resin (with a modulus of elasticity of 9.2 GPa) and had a thickness of 10 μm; the hard coat substrate had a thickness of 30 μm; the third adhesive layer had a thickness of 15 μm; the first base coat film was constituted of a silicon oxynitride film (with a modulus of elasticity of 133 GPa) having a thickness of 0.05 μm; the first adhesive layer had a thickness of 15 μm; the stress adjusting layer was constituted of a polyethylene terephthalate film (with a modulus of elasticity of 3.6 GPa) having a thickness of 40 μm; whereas the rigidifying layer was omitted.

Test Example 3

Test Example 3 differed from Test Example 1 in that: the hard coat layer was constituted of a UV-curable nanosilica-silane-acrylate resin (with a modulus of elasticity of 5 GPa) and had a thickness of 5 μm; the hard coat substrate was constituted of a polyimide resin (with a modulus of elasticity of 2 GPa) and had a thickness of 5 μm; the touch panel substrate was constituted of a polyimide resin (with a modulus of elasticity of 2 GPa) and having a thickness of 5 μm; the second adhesive layer had a thickness of 5 μm; the color filter substrate was constituted of a polyimide resin (with a modulus of elasticity of 2 GPa) and had a thickness of 10 μm; the second moisture-proof layer had a thickness of 1 μm; the sealing film was constituted of a silicon nitride film (with a modulus of elasticity of 200 GPa) having a thickness of 10 μm; the first base coat film was constituted of a silicon oxynitride film (with a modulus of elasticity of 133 GPa) having a thickness of 0.05 μm; the resin substrate layer was constituted of a polyimide resin (with a modulus of elasticity of 2 GPa) and had a thickness of 10 μm; whereas the first adhesive layer, the stress adjusting layer, and the rigidifying layer were omitted.

Test Example 4

Test Example 4 differed from Test Example 1 in that: the hard coat layer was constituted of a UV-curable nanosilica-silane-acrylate resin (with a modulus of elasticity of 5 GPa) and had a thickness of 5 μm; the hard coat substrate was constituted of a polyimide resin (with a modulus of elasticity of 2 GPa) and had a thickness of 5 μm; the touch panel substrate was constituted of a polyimide resin (with a modulus of elasticity of 2 GPa) and having a thickness of 5 μm; the second adhesive layer had a thickness of 5 μm; an inorganic layer constituted of a silicon nitride film (with a modulus of elasticity of 81 GPa) having a thickness of 5 μm was added to be interposed between the color filter substrate and the second moisture-proof layer; the first base coat film was constituted of a silicon oxynitride film (with a modulus of elasticity of 133 GPa) having a thickness of 0.05 μm; an inorganic layer constituted of a silicon nitride film (with a modulus of elasticity of 81 GPa) having a thickness of 5 μm was added to be interposed between the base coat film and the resin substrate layer; whereas the first adhesive layer, the stress adjusting layer, and the rigidifying layer were omitted.

Test Example 5

Test Example 5 differed from Test Example 1 in that: the hard coat layer was constituted of a UV-curable nanosilica-silane-acrylate resin (with a modulus of elasticity of 5 GPa) and had a thickness of 5 μm; the hard coat substrate was constituted of a polyimide resin (with a modulus of elasticity of 2 GPa) and had a thickness of 5 μm; the touch panel substrate was constituted of a polyimide resin (with a modulus of elasticity of 2 GPa) and having a thickness of 5 μm; the second adhesive layer had a thickness of 5 μm; the color filter substrate was constituted of a polyethylene terephthalate film (with a modulus of elasticity of 2 GPa) having a thickness of 10 μm; an inorganic layer constituted of a silicon nitride film (with a modulus of elasticity of 81 GPa) having a thickness of 5 μm was added to be interposed between the color filter substrate and the second moisture-proof layer; the second moisture-proof layer had a thickness of 1 μm; the sealing film was constituted of a silicon nitride film (with a modulus of elasticity of 200 GPa) having a thickness of 10 μm; the first base coat film was constituted of a silicon oxynitride film (with a modulus of elasticity of 133 GPa) having a thickness of 0.05 μm; an inorganic layer constituted of a silicon nitride film (with a modulus of elasticity of 81 GPa) having a thickness of 5 μm was added to be interposed between the base coat film and the resin substrate layer; the resin substrate layer was constituted of a polyimide resin (with a modulus of elasticity of 2 GPa) and had a thickness of 10 μm; whereas the first adhesive layer, the stress adjusting layer, and the rigidifying layer were omitted.

Test Example 6

Test Example 6 differed from Test Example 1 in that: the hard coat layer had a thickness of 5 μm; the touch panel substrate was constituted of a polyimide resin (with a modulus of elasticity of 2 GPa) and having a thickness of 5 μm; the second adhesive layer had a thickness of 5 μm; the first base coat film was constituted of a silicon oxynitride film (with a modulus of elasticity of 133 GPa) having a thickness of 0.05 μm; and the rigidifying layer had a thickness of 0.55 μm.

Test Example 7

Test Example 7 differed from Test Example 1 in that: the hard coat layer was constituted of a UV-curable nanosilica-silane-acrylate resin (with a modulus of elasticity of 9.2 GPa) and had a thickness of 10 μm; the hard coat substrate had a thickness of 30 μm; the third adhesive layer had a thickness of 15 μm; the first base coat film was constituted of a silicon oxynitride film (with a modulus of elasticity of 133 GPa) having a thickness of 0.05 μm; whereas the first adhesive layer, the stress adjusting layer, and the rigidifying layer were omitted.

Test Example 8

Test Example 8 differed from Test Example 1 in that: the hard coat layer was constituted of a UV-curable nanosilica-silane-acrylate resin (with a modulus of elasticity of 5 GPa)

and had a thickness of 5 µm; the hard coat substrate was constituted of a polyimide resin (with a modulus of elasticity of 2 GPa) and had a thickness of 5 µm; an inorganic layer constituted of a silicon nitride film (with a modulus of elasticity of 81 GPa) having a thickness of 4 µm was added to be interposed between the third adhesive layer and the touch panel's second interconnecting layer; the second adhesive layer had a thickness of 9 µm; the second moisture-proof layer was constituted of a silicon nitride film (with a modulus of elasticity of 81 GPa) having a thickness of 0.5 µm; the first moisture-proof layer was constituted of a silicon nitride film (with a modulus of elasticity of 81 GPa) having a thickness of 0.1 µm; the first base coat film was constituted of a silicon oxynitride film (with a modulus of elasticity of 133 GPa) having a thickness of 0.05 µm; the resin substrate layer was constituted of a polyimide resin (with a modulus of elasticity of 2 GPa) and had a thickness of 10 µm; whereas the first adhesive layer, the stress adjusting layer, and the rigidifying layer were omitted.

Test Example 9

Test Example 9 differed from Test Example 1 in that: the hard coat layer was constituted of a UV-curable nanosilica-silane-acrylate resin (with a modulus of elasticity of 9.2 GPa) and had a thickness of 10 µm; the hard coat substrate was constituted of a polyimide resin (with a modulus of elasticity of 2 GPa) and had a thickness of 5 µm; the touch panel substrate was constituted of a polyimide resin (with a modulus of elasticity of 2 GPa) and having a thickness of 5 µm; the second adhesive layer had a thickness of 5 µm; an inorganic layer constituted of a silicon nitride film (with a modulus of elasticity of 81 GPa) having a thickness of 5 µm was added to be interposed between the color filter substrate and the second moisture-proof layer; the first base coat film was constituted of a silicon oxynitride film (with a modulus of elasticity of 133 GPa) having a thickness of 0.05 µm; whereas the first adhesive layer, the stress adjusting layer, and the rigidifying layer were omitted.

Test Example 10

Test Example 10 differed from Test Example 1 in that: the hard coat layer was constituted of a UV-curable nanosilica-silane-acrylate resin (with a modulus of elasticity of 5 GPa) and had a thickness of 5 µm; the hard coat substrate was constituted of a polyimide resin (with a modulus of elasticity of 2 GPa) and had a thickness of 5 µm; the touch panel substrate was constituted of a polyimide resin (with a modulus of elasticity of 2 GPa) and having a thickness of 5 µm; the second adhesive layer had a thickness of 5 µm; the color filter substrate was constituted of a polyimide resin (with a modulus of elasticity of 2 GPa) and had a thickness of 10 µm; an inorganic layer constituted of a silicon nitride film (with a modulus of elasticity of 81 GPa) having a thickness of 5 µm was added to be interposed between the color filter substrate and the second moisture-proof layer; the second moisture-proof layer had a thickness of 1 µm; the sealing film was constituted of a silicon nitride film (with a modulus of elasticity of 200 GPa) having a thickness of 10 µm; the first base coat film was constituted of a silicon oxynitride film (with a modulus of elasticity of 133 GPa) having a thickness of 0.05 µm; the resin substrate layer was constituted of a polyimide resin (with a modulus of elasticity of 2 GPa) and had a thickness of 10 µm; whereas the first adhesive layer, the stress adjusting layer, and the rigidifying layer were omitted.

Test Example 11

Test Example 11 differed from Test Example 1 in that: the hard coat layer had a thickness of 5 µm; the first base coat film was constituted of a silicon oxynitride film (with a modulus of elasticity of 133 GPa) having a thickness of 0.05 µm; whereas the first adhesive layer, the stress adjusting layer, and the rigidifying layer were omitted.

Test Example 12

Test Example 12 differed from Test Example 1 in that: the hard coat layer had a thickness of 5 µm; the touch panel substrate was constituted of a polyimide resin (with a modulus of elasticity of 2 GPa) and having a thickness of 5 µm; the second adhesive layer had a thickness of 5 µm; and the first base coat film was constituted of a silicon oxynitride film (with a modulus of elasticity of 133 GPa) having a thickness of 0.05 µm, whereas the first adhesive layer, the stress adjusting layer, and the rigidifying layer were omitted.

Based on the results of Test Examples 1 to 12 (see the table of FIG. 13), a relationship between the inorganic rigidity rate and the radius of crease $r_c$ was graphed in FIG. 14. As can be seen, the radius of crease $r_c$ has a positive correlation with the inorganic rigidity rate. As will be described later, it has been found that a crease on the organic EL display device 50a highly probably has a radius of crease $r_c$ of 81 mm or larger (preferably 101 mm or larger) if the inorganic rigidity rate is 0.78 or higher and 1 or lower (preferably 0.83 or higher and 1 or lower).

As can be seen from the foregoing description, the organic EL display device 50a of this embodiment can provide the following advantages.

The inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower). As a result, the radius of crease $r_c$ of the organic EL display device 50a is likely to be 81 mm or larger (preferably 101 mm or larger). This feature can make a crease on the organic EL display device 50a inconspicuous, and prevent or reduce degradation in the quality of appearance of the organic EL display device 50a.

Second Embodiment

Figure 15:
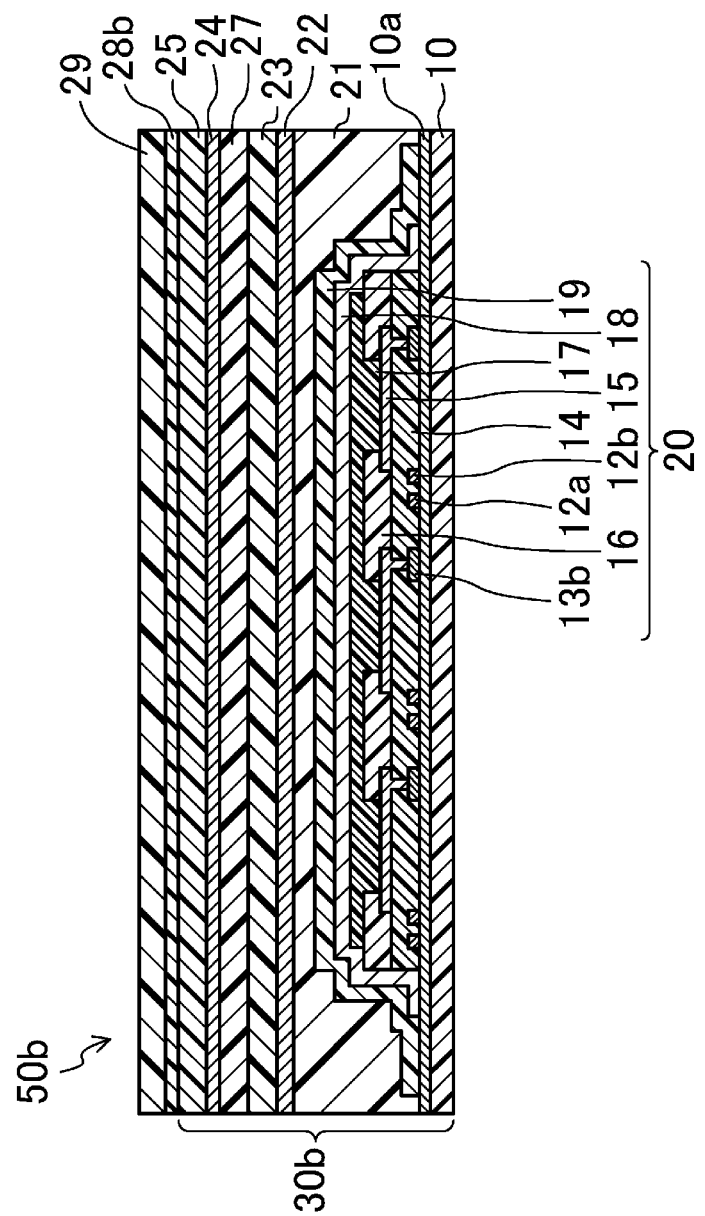
FIG. 15 is a cross-sectional view of an organic EL display device according to a second embodiment of the present invention.

FIGS. 15 to 18 show an organic EL display device according to a second embodiment of the present invention. Here, FIG. 15 is a cross-sectional view of the organic EL display device 50b according to this embodiment. In the embodiments below, components equivalent to those shown in FIGS. 1 to 14 are denoted by the same reference characters, and the detailed explanation thereof will be omitted.

In the first embodiment described above, the organic EL display device 50a in which the touch panel 27 is provided over the organic EL display panel 30a has been exemplified. In this embodiment, the organic EL display device 50b is exemplified in which a touch panel 27 is provided within an organic EL display panel 30b.

As shown in FIG. 15, the organic EL display device 50b includes: the organic EL display panel 30b; and a hard coat 29 provided over the organic EL display panel 30b with an adhesive layer 28b interposed therebetween. Note that the structure of each of pixels arranged in a display region of the organic EL display device 50b is substantially the same as that of each of the pixels arranged in the display region of the organic EL display device 50a of the first embodiment.

As shown in FIG. 15, the organic EL display panel 30b includes, a resin substrate layer 10, an organic EL element layer 20, a color filter 23, the touch panel 27, and a color filter substrate 25. The organic EL element layer 20, the color filter 23, the touch panel 27, and the color filter substrate 25 are provided in this order over a surface (upper surface in FIG. 15) of the resin substrate layer 10.

As shown in FIG. 15, a base coat film 10a is provided on a surface (upper surface in FIG. 15) of the resin substrate layer 10. The base coat film 10a is constituted of a single-layer film, such as a silicon nitride film, a silicon oxide film, a silicon oxynitride film, and the like, or a multilayer film including two or more of these films (in the below-mentioned Test Example 13, a multilayer film is adopted which includes a silicon oxide film provided as an upper layer and functioning a second base coat film, and a silicon oxynitride film provided as a lower layer and functioning as a first base coat film).

A sealing film 19 of the organic EL element layer 20 is made of, for example, an inorganic material such as silicon dioxide ($SiO_2$), aluminum oxide ($Al_2O_3$), silicon nitride (SiNx, where x is a positive number) such as trisilicon tetranitride ($Si_3N_4$), silicon carbonitride (SiCN), and the like, or an organic material such as acrylate, polyurea, parylene, polyimide, polyamide, and the like (in the below-mentioned Test Example 13, silicon nitride is adopted).

As shown in FIG. 15, the color filter 23 is provided on a surface (lower surface in FIG. 15) of the touch panel 27. As shown in FIG. 15, a first moisture-proof layer 22 is provided on a surface (a lower surface in FIG. 15) of the color filter 23. As shown in FIG. 15, a filling layer 21 is provided between the organic EL element layer 20 and the first moisture-proof layer 22.

The color filter substrate 25 is made of, for example, a polyimide resin, a polyethylene terephthalate resin, a polyethylene naphthalate resin, an aramid resin, a (meth)acrylate resin, or the like (in the below-mentioned Test Example 13, a polyethylene terephthalate resin is adopted).

The touch panel 27 includes, for example, a touch panel substrate, a touch panel's first interconnecting layer provided on the back face of the touch panel substrate, and a touch panel's second interconnecting layer provided on the front face of the touch panel substrate. Thus, the touch panel 27 has a projected capacitive structure. The touch panel substrate is made of, for example, a polyimide resin, a polyethylene terephthalate resin, a polyethylene naphthalate resin, an aramid resin, a (meth)acrylate resin, or the like (in the below-mentioned Test Example 13, a polyimide resin is adopted). The touch panel's first interconnecting layer and the touch panel's second interconnecting layer are each made of a metal film of, for example, copper or the like (in the below-mentioned Test Example 13, copper is adopted). As shown in FIG. 15, a second moisture-proof layer 24 is provided between the touch panel 27 and the color filter substrate 25. The first and second moisture-proof layers 22 and 24 are each constituted of an inorganic insulating film made of, for example, a single-layer silicon nitride film, a single-layer silicon oxide film, a single-layer silicon oxynitride film, or the like, or a multilayer film including two or more of these films (in the below-mentioned Test Example 13, a single-layer silicon nitride film is adopted for each of the moisture-proof layers).

The hard coat 29 includes a hard coat substrate and a hard coat layer provided on the hard coat substrate. The hard coat substrate is constituted of a plastic film made of, for example, polyimide, polyethylene terephthalate, polyethylene naphthalate, aramid, (meth)acrylate, or the like (in the below-mentioned Test Example 13, a polyimide resin is adopted). The hard coat layer is made of, for example, a UV-curable organosilicon resin, a thermosetting resin, an acrylic resin, a urethane resin, a polysiloxane resin, an inorganic insulating film, or the like (in the below-mentioned Test Example 13, a silicon nitride film is adopted). As shown in FIG. 15, an adhesive layer 28b is provided between the color filter substrate 25 and the hard coat 29. The adhesive layer 28b is constituted of, for example, a photo-curable adhesive sheet, a UV-curable adhesive, a thermosetting adhesive, an epoxy adhesive, a cyanoacrylate instant adhesive, or the like (in the below-mentioned Test Example 13, a UV-curable acrylic resin is adopted).

Just like the organic EL display device 50a of the first embodiment, the organic EL display device 50b having the above configuration displays an image when a light-emitting layer 3 appropriately emits light in each of the sub-pixels P.

The organic EL display device 50b of this embodiment can be fabricated through appropriate modification of the method for fabricating the organic EL display device 50a of the first embodiment.

As described earlier, the organic EL display device 50b is comprised of the device body including the plurality of organic layers made of organic materials and the plurality of inorganic layers made of inorganic materials, the plurality of organic layers and the plurality of inorganic layers being stacked together. The organic layers include, for example, the resin substrate layer 10, the second protective insulating film, a main portion of the organic EL layer 17, the filling layer 21, the color filter 23, the touch panel substrate, the color filter substrate 25, the adhesive layer 28b, the hard coat substrate, and the like. The inorganic layers include, for example, the base coat film 10a, the gate insulating film, the gate electrodes, the interlayer insulating film, the first protective insulating film, the sealing film 19, the first moisture-proof layer 22, the second moisture-proof layer 24, the touch panel's first interconnecting layer, the touch panel's second interconnecting layer, the hard coat layer, and the like.

As will be described later, in order to make a crease of the organic EL display device 50b have a radius of 100 mm or larger, the organic EL display device 50b is configured such that an inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower).

Figures 17, 18:
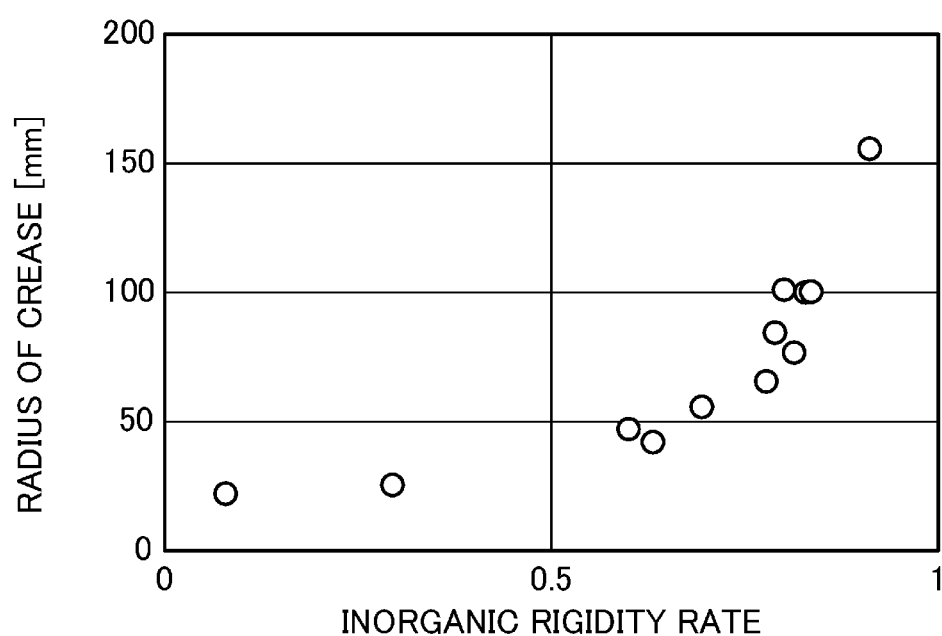
FIG. 17 is a table showing a radius of crease and an inorganic rigidity rate of each of Test Examples 13 to 24 that were specifically tested, as examples of the organic EL display device according to the second embodiment of the present invention.
FIG. 18 is a graph showing a relationship between the inorganic rigidity rate and the radius of crease of Test Examples 13 to 24 that were specifically tested, as examples of the organic EL display device according to the second embodiment of the present invention.

Next, tests that were specifically carried out will be described with reference to FIGS. 16 to 18. FIG. 16 is a table showing the details of Test Example 13 that was specifically tested, as an example of the organic EL display device 50b. FIG. 17 is a table showing a radius of crease and an inorganic rigidity rate of each of Test Examples 13 to 24 that were specifically tested, as examples of the organic EL display device 50b. FIG. 18 is a graph showing a relationship between the inorganic rigidity rate and the radius of crease of Test Examples 13 to 24 that were specifically tested, as the examples of the organic EL display device 50b.

As an example (Test Example 13) of this embodiment, an organic EL display device 50b having the configuration shown in the table of FIG. 16 and a size of 3.4 inches diagonal was prepared. An inorganic rigidity rate and a radius of crease $r_c$ of the prepared organic EL display device 50b were determined in the same manner as in the first embodiment (see the table of FIG. 17).

Likewise, organic EL display devices of Test Examples 14 to 24 were each prepared under the following conditions, and an inorganic rigidity rate and a radius of crease $r_c$ were determined for each test example. In the following description of each of Test Examples, differences from Test Example 13 will be described.

Test Example 14

Test Example 14 differed from Test Example 13 in that: the hard coat layer was constituted of a UV-curable nano-silica-silane-acrylate resin (with a modulus of elasticity of 9.2 GPa) and had a thickness of 10 μm; the hard coat substrate was constituted of a polyethylene terephthalate film (with a modulus of elasticity of 3.53 GPa) having a thickness of 30 μm; the adhesive layer had a thickness of 15 μm; the color filter substrate was constituted of a polyimide resin (with a modulus of elasticity of 4.64 GPa) and had a thickness of 12 μm; the second moisture-proof layer had a thickness of 0.5 μm; the touch panel substrate was constituted of a polyimide resin (with a modulus of elasticity of 4.65 GPa) and had a thickness of 16 μm; the sealing film was constituted of a silicon nitride film (with a modulus of elasticity of 81 GPa) having a thickness of 3.5 μm; the resin substrate layer was constituted of a polyimide resin (with a modulus of elasticity of 6.51 GPa) and had a thickness of 12 μm; and an adhesive layer constituted of a UV-curable acrylic resin (with a modulus of elasticity of 0.001 GPa) and having a thickness of 15 μm, and a stress adjusting layer constituted of a polyethylene terephthalate film (with a modulus of elasticity of 3.6 GPa) having a thickness of 35.8 μm were added to be provided adjacent to the back face of the resin substrate layer in the stated order.

Test Example 15

Test Example 15 differed from Test Example 13 in that: the hard coat layer was constituted of a UV-curable nano-silica-silane-acrylate resin (with a modulus of elasticity of 5 GPa) and had a thickness of 5 μm; and the sealing film had a thickness of 10 μm.

Test Example 16

Test Example 16 differed from Test Example 13 in that: the hard coat layer was constituted of a UV-curable nano-silica-silane-acrylate resin (with a modulus of elasticity of 5 GPa) and had a thickness of 5 μm; the color filter substrate was constituted of a polyimide resin (with a modulus of elasticity of 4.64 GPa) and had a thickness of 12 μm; an inorganic layer constituted of a silicon nitride film (with a modulus of elasticity of 81 GPa) having a thickness of 5 μm was added to be interposed between the color filter substrate and the second moisture-proof layer; the second moisture-proof layer had a thickness of 0.5 μm; the touch panel substrate was constituted of a polyimide resin (with a modulus of elasticity of 4.65 GPa) and had a thickness of 16 μm; the sealing film was constituted of a silicon nitride film (with a modulus of elasticity of 81 GPa) having a thickness of 3.5 μm; an inorganic layer constituted of a silicon nitride film (with a modulus of elasticity of 81 GPa) having a thickness of 5 μm was added to be interposed between the first base coat film and the resin substrate layer; and the resin substrate layer was constituted of a polyimide resin (with a modulus of elasticity of 6.51 GPa) and had a thickness of 12 μm.

Test Example 17

Test Example 17 differed from Test Example 13 in that: the hard coat layer was constituted of a UV-curable nano-silica-silane-acrylate resin (with a modulus of elasticity of 5 GPa) and had a thickness of 5 μm; an inorganic layer constituted of a silicon nitride film (with a modulus of elasticity of 81 GPa) having a thickness of 5 μm was added to be interposed between the color filter substrate and the second moisture-proof layer; the sealing film had a thickness of 10 μm; and an inorganic layer constituted of a silicon nitride film (with a modulus of elasticity of 81 GPa) having a thickness of 5 μm was added to be interposed between the first base coat film and the resin substrate layer.

Test Example 18

Test Example 18 differed from Test Example 13 in that: the hard coat layer had a thickness of 5 μm; the color filter substrate was constituted of a polyimide resin (with a modulus of elasticity of 4.64 GPa) and had a thickness of 12 μm; the second moisture-proof layer had a thickness of 0.5 μm; the touch panel substrate was constituted of a polyimide resin (with a modulus of elasticity of 4.65 GPa) and had a thickness of 16 μm; the sealing film was constituted of a silicon nitride film (with a modulus of elasticity of 81 GPa) having a thickness of 3.5 μm; the resin substrate layer was constituted of a polyimide resin (with a modulus of elasticity of 6.51 GPa) and had a thickness of 12 μm; and an adhesive layer constituted of a UV-curable acrylic resin (with a modulus of elasticity of 0.001 GPa) and having a thickness of 5 μm, a stress adjusting layer constituted of a polyethylene terephthalate film (with a modulus of elasticity of 3.53 GPa) having a thickness of 5 μm, and an inorganic layer constituted of a silicon nitride film (with a modulus of elasticity of 81 GPa) having a thickness of 0.67 μm were added to be provided adjacent to the back face of the resin substrate layer in the stated order.

Test Example 19

Test Example 19 differed from Test Example 13 in that: the hard coat layer had a thickness of 5 μm; the color filter substrate was constituted of a polyimide resin (with a modulus of elasticity of 4.64 GPa) and had a thickness of 10 μm; the second moisture-proof layer had a thickness of 0.5 μm; the touch panel substrate was constituted of a polyimide resin (with a modulus of elasticity of 4.65 GPa) and had a thickness of 5 μm; the sealing film was constituted of a silicon nitride film (with a modulus of elasticity of 81 GPa) having a thickness of 3.5 μm; the resin substrate layer was constituted of a polyimide resin (with a modulus of elasticity of 6.51 GPa) and had a thickness of 10 μm; and an adhesive layer constituted of a UV-curable acrylic resin (with a modulus of elasticity of 0.1 GPa) and having a thickness of 5 μm, a stress adjusting layer constituted of a polyethylene terephthalate film (with a modulus of elasticity of 3.53 GPa) having a thickness of 5 μm, and an inorganic layer constituted of a silicon nitride film (with a modulus of elasticity of 81 GPa) having a thickness of 0.49 μm were added to be provided adjacent to the back face of the resin substrate layer in the stated order.

Test Example 20

Test Example 20 differed from Test Example 13 in that: the hard coat layer was constituted of a UV-curable nano-silica-silane-acrylate resin (with a modulus of elasticity of 9.2 GPa) and had a thickness of 10 μm; the hard coat substrate was constituted of a polyethylene terephthalate film (with a modulus of elasticity of 3.53 GPa) having a thickness of 30 μm; the adhesive layer had a thickness of 15 μm; and the color filter substrate was constituted of a polyimide resin (with a modulus of elasticity of 4.64 GPa) and had a thickness of 12 μm; the second moisture-proof layer had a thickness of 0.5 μm; the touch panel substrate was constituted of a polyimide resin (with a modulus of elasticity of 4.65 GPa) and had a thickness of 16 μm; the sealing film was constituted of a silicon nitride film (with a modulus of elasticity of 81 GPa) having a thickness of 3.5 μm; and the resin substrate layer was constituted of a polyimide resin (with a modulus of elasticity of 6.51 GPa) and had a thickness of 12 μm.

Test Example 21

Test Example 21 differed from Test Example 13 in that: the hard coat layer was constituted of a UV-curable nano-silica-silane-acrylate resin (with a modulus of elasticity of 5 GPa) and had a thickness of 5 μm; the color filter substrate was constituted of a polyimide resin (with a modulus of elasticity of 4.64 GPa) and had a thickness of 12 μm; an inorganic layer constituted of a silicon nitride film (with a modulus of elasticity of 81 GPa) having a thickness of 5 μm was added to be interposed between the color filter substrate and the second moisture-proof layer; the second moisture-proof layer had a thickness of 0.5 μm; the touch panel substrate was constituted of a polyimide resin (with a modulus of elasticity of 4.65 GPa) and had a thickness of 16 μm; the sealing film was constituted of a silicon nitride film (with a modulus of elasticity of 81 GPa) having a thickness of 3.5 μm; and the resin substrate layer was constituted of a polyimide resin (with a modulus of elasticity of 6.51 GPa) and had a thickness of 12 μm.

Test Example 22

Test Example 22 differed from Test Example 13 in that: the hard coat layer was constituted of a UV-curable nano-silica-silane-acrylate resin (with a modulus of elasticity of 5 GPa) and had a thickness of 5 μm; an inorganic layer constituted of a silicon nitride film (with a modulus of elasticity of 81 GPa) having a thickness of 5 μm was added to be interposed between the color filter substrate and the second moisture-proof layer; and the sealing film had a thickness of 10 μm.

Test Example 23

Test Example 23 differed from Test Example 13 in that: the hard coat layer had a thickness of 3.05 μm; the color filter substrate was constituted of a polyimide resin (with a modulus of elasticity of 4.64 GPa) and had a thickness of 12 μm; the second moisture-proof layer had a thickness of 0.5 μm; the touch panel substrate was constituted of a polyimide resin (with a modulus of elasticity of 4.65 GPa) and had a thickness of 16 μm; the sealing film was constituted of a silicon nitride film (with a modulus of elasticity of 81 GPa) having a thickness of 3.5 μm; and the resin substrate layer was constituted of a polyimide resin (with a modulus of elasticity of 6.51 GPa) and had a thickness of 12 μm.

Test Example 24

Test Example 24 differed from Test Example 13 in that: the color filter substrate was constituted of a polyimide resin (with a modulus of elasticity of 4.64 GPa) and had a thickness of 12 μm; the second moisture-proof layer had a thickness of 0.5 μm; the touch panel substrate was constituted of a polyimide resin (with a modulus of elasticity of 4.65 GPa) and had a thickness of 16 μm; the sealing film was constituted of a silicon nitride film (with a modulus of elasticity of 81 GPa) having a thickness of 3.5 μm; and the resin substrate layer was constituted of a polyimide resin (with a modulus of elasticity of 6.51 GPa) and had a thickness of 10 μm.

Based on the results of Test Examples 13 to 24 (see the table of FIG. 17), a relationship between the inorganic rigidity rate and the radius of crease $r_c$ was graphed in FIG. 18. As can be seen, the radius of crease $r_c$ has a positive correlation with the inorganic rigidity rate. As will be described later, it has been found that a crease on the organic EL display device 50b highly probably has a radius of crease $r_c$ of 81 mm or larger (preferably 101 mm or larger) if the inorganic rigidity rate is 0.78 or higher and 1 or lower (preferably 0.83 or higher and 1 or lower).

As can be seen from the foregoing description, the organic EL display device 50b of this embodiment can provide the following advantages.

The inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower). As a result, the radius of crease $r_c$ of a crease on the organic EL display device 50b is likely to be 81 mm or larger (preferably 101 mm or larger). This feature can make a crease on the organic EL display device 50b inconspicuous, and prevent or reduce degradation in the quality of appearance of the organic EL display device 50b.

Third Embodiment

Figure 19:
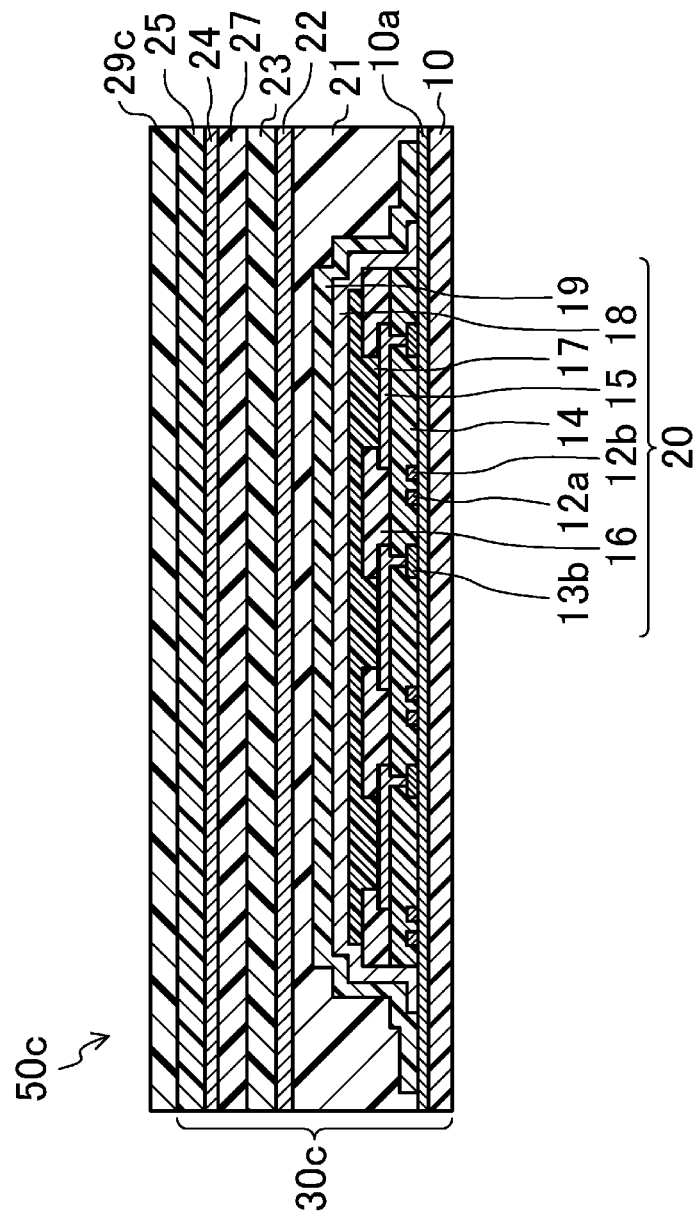
FIG. 19 is a cross-sectional view of an organic EL display device according to a third embodiment of the present invention.

FIGS. 19 to 22 show an organic EL display device according to a third embodiment of the present invention. Here, FIG. 19 is a cross-sectional view of the organic EL display device 50c according to this embodiment.

In the first and second embodiments, the organic EL display devices 50a and 50b have been respectively exemplified, each of which includes the hard coat substrate and the color filter substrate that are configured as separate components. The organic EL display device 50c of this embodiment includes a common substrate functioning as both a hard coat substrate and a color filter substrate.

As shown in FIG. 19, the organic EL display device 50c includes: an organic EL display panel 30c; and a hard coat 29c provided on the organic EL display panel 30c. Note that the structure of each of pixels arranged in a display region of the organic EL display device 50c is substantially the same as that of each of the pixels arranged in the display region of the organic EL display device 50a of the first embodiment.

As shown in FIG. 19, the organic EL display panel 30c includes a resin substrate layer 10, an organic EL element layer 20, a color filter 23, a touch panel 27, and a color filter substrate 25. The organic EL element layer 20, the color filter 23, the touch panel 27, and the color filter substrate 25 are provided in this order over a surface (upper surface in FIG. 19) of the resin substrate layer 10.

As shown in FIG. 19, a base coat film 10a is provided on a surface (upper surface in FIG. 19) of the resin substrate layer 10. The base coat film 10a is constituted of a single-layer film, such as a silicon nitride film, a silicon oxide film, a silicon oxynitride film, and the like, or a multilayer film including two or more of these films (in the below-mentioned Test Example 25, a multilayer film is adopted which includes a silicon oxide film provided as an upper layer and functioning as a second base coat film, and a silicon oxynitride film provided as a lower layer and functioning as a first base coat film).

A sealing film 19 of the organic EL element layer 20 is made of, for example, an inorganic material such as silicon dioxide ($SiO_2$), aluminum oxide ($Al_2O_3$), silicon nitride ($SiN_x$, where x is a positive number) such as trisilicon tetranitride ($Si_3N_4$), silicon carbonitride (SiCN), and the like, or an organic material such as acrylate, polyurea, parylene, polyimide, polyamide, and the like (in the below-mentioned Test Example 25, silicon nitride is adopted).

As shown in FIG. 19, the color filter 23 is provided on a surface (a lower surface in FIG. 19) of the touch panel 27. As shown in FIG. 19, a first moisture-proof layer 22 is provided on a surface (a lower surface in FIG. 19) of the color filter 23. As shown in FIG. 19, a filling layer 21 is provided between the organic EL element layer 20 and the first moisture-proof layer 22.

The color filter substrate 25 is made of, for example, a polyimide resin, a polyethylene terephthalate resin, a polyethylene naphthalate resin, an aramid resin, a (meth)acrylate resin, or the like (in the below-mentioned Test Example 25, a polyimide resin is adopted).

The touch panel 27 includes, for example, a touch panel substrate, a touch panel's first interconnecting layer provided on the back face of the touch panel substrate, and a touch panel's second interconnecting layer provided on the front face of the touch panel substrate. Thus, the touch panel 27 has a projected capacitive structure. The touch panel substrate is made of, for example, a polyimide resin, a polyethylene terephthalate resin, a polyethylene naphthalate resin, an aramid resin, a (meth)acrylate resin, or the like (in the below-mentioned Test Example 25, a polyimide resin is adopted). The touch panel's first interconnecting layer and the touch panel's second interconnecting layer are each made of a metal film of, for example, copper or the like (in the below-mentioned Test Example 25, copper is adopted). As shown in FIG. 19, a second moisture-proof layer 24 is provided between the touch panel 27 and the color filter substrate 25. The first and second moisture-proof layers 22 and 24 are each constituted of an inorganic insulating film made of, for example, a single-layer silicon nitride film, a single-layer silicon oxide film, a single-layer silicon oxynitride film, or the like, or a multilayer film including two or more of these films (in the below-mentioned Test Example 25, a single-layer silicon nitride film is adopted for each of the moisture-proof layers).

The hard coat 29c is a hard coat layer provided on the color filter substrate 25 that functions also as a hard coat substrate. Here, the hard coat 29c is made of, for example, a UV-curable organosilicon resin, a thermosetting resin, an acrylic resin, a urethane resin, a polysiloxane resin, an inorganic insulating film, or the like (in the below-mentioned Test Example 25, a silicon nitride film is adopted).

Just like the organic EL display device 50a of the first embodiment described above, the organic EL display device 50c having the above configuration displays an image when a light-emitting layer 3 appropriately emits light in each of the sub-pixels P.

The organic EL display device 50c of this embodiment can be fabricated through appropriate modification of the method for fabricating the organic EL display device 50a of the first embodiment.

As described earlier, the organic EL display device 50c is comprised of a device body including the plurality of organic layers made of organic materials and the plurality of inorganic layers made of inorganic materials, the plurality of organic layers and the plurality of inorganic layers being stacked together. The organic layers include, for example, the resin substrate layer 10, the second protective insulating film, a main portion of the organic EL layer 17, the filling layer 21, the color filter 23, the touch panel substrate, the color filter substrate 25, and the like. The inorganic layers include, for example, the base coat film 10a, the gate insulating film, the gate electrodes, the interlayer insulating film, the first protective insulating film, the sealing film 19, the first moisture-proof layer 22, the second moisture-proof layer 24, the touch panel's first interconnecting layer, the touch panel's second interconnecting layer, the hard coat 29c, and the like.

As will be described later, in order to make a crease on the organic EL display device 50c have a radius of 100 mm or larger, the organic EL display device 50c is configured such that an inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower).

Figures 21, 22:
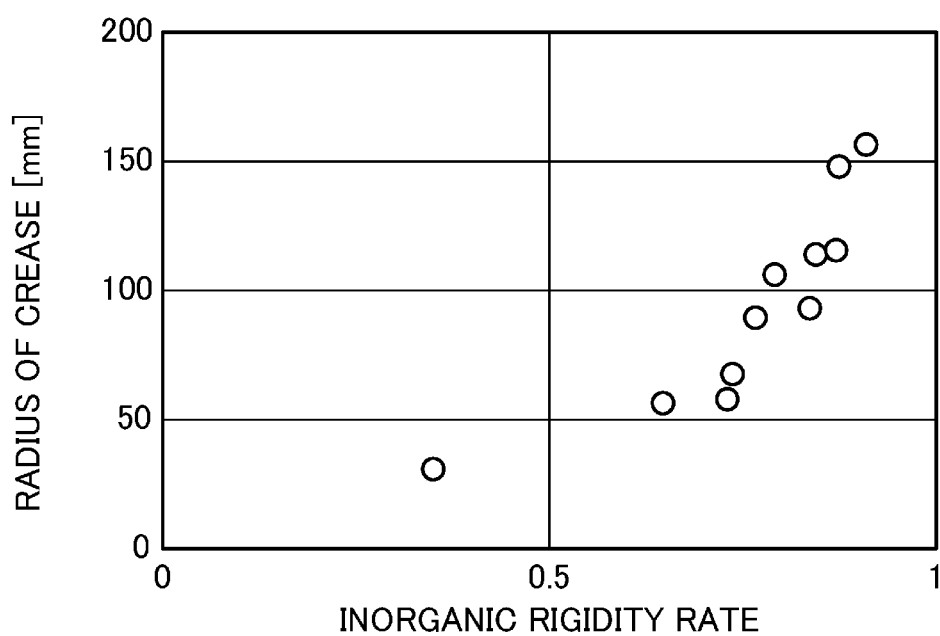
FIG. 21 is a table showing a radius of crease and an inorganic rigidity rate of each of Test Examples 25 to 35 that were specifically tested, as examples of the organic EL display device according to the third embodiment of the present invention.
FIG. 22 is a graph showing a relationship between the inorganic rigidity rate and the radius of crease of Test Examples 25 to 35 that were specifically tested, as examples of the organic EL display device according to the third embodiment of the present invention.

Next, tests that were specifically carried out will be described with reference to FIGS. 20 to 22. Here, FIG. 20 is a table showing the details of Test Example 25 that was specifically tested, as an example of the organic EL display device 50c. FIG. 21 is a table showing a radius of crease and an inorganic rigidity rate of each of Test Examples 25 to 35 that were specifically tested, as examples of the organic EL display device 50c. FIG. 22 is a graph showing a relationship between the inorganic rigidity rate and the radius of crease of Test Examples 25 to 35 that were specifically tested, as the examples of the organic EL display device 50c.

As an example (Test Example 25) of this embodiment, an organic EL display device 50c having the configuration shown in the table of FIG. 20 and a size of 3.4 inches diagonal was prepared. An inorganic rigidity rate and a radius of crease $r_c$ of the organic EL display device 50c were determined in the same manner as in the first embodiment (see the table of FIG. 21).

Likewise, organic EL display devices of Test Examples 26 to 35 were each prepared under the following conditions, and an inorganic rigidity rate and a radius of crease $r_c$ were determined for each test example. In the following description of each of Test Examples, differences from Test Example 25 will be described.

Test Example 26

Test Example 26 differed from Test Example 25 in that: the hard coat was constituted of a UV-curable nanosilicasilane-acrylate resin (with a modulus of elasticity of 9.2 GPa) and had a thickness of 10 µm.

Test Example 27

Test Example 27 differed from Test Example 25 in that: the hard coat was constituted of a UV-curable nanosilica-silane-acrylate resin (with a modulus of elasticity of 5 GPa) and had a thickness of 5 µm; the color filter substrate was constituted of a polyethylene terephthalate resin (with a modulus of elasticity of 2 GPa) and had a thickness of 10 µm; the second moisture-proof layer had a thickness of 1 µm; the touch panel substrate was constituted of a polyimide resin (with a modulus of elasticity of 2 GPa) and having a thickness of 5 µm; the sealing film was constituted of a silicon nitride film (with a modulus of elasticity of 200 GPa) having a thickness of 10 µm; and the resin substrate layer was constituted of a polyimide resin (with a modulus of elasticity of 2 GPa) and had a thickness of 10 µm.

Test Example 28

Test Example 28 differed from Test Example 25 in that: the hard coat was constituted of a UV-curable nanosilica-silane-acrylate resin (with a modulus of elasticity of 5 GPa) and had a thickness of 5 µm; an inorganic layer constituted of a silicon nitride film (with a modulus of elasticity of 81 GPa) having a thickness of 5 µm was added to be interposed between the color filter substrate and the second moisture-proof layer; and an inorganic layer constituted of a silicon nitride film (with a modulus of elasticity of 81 GPa) having a thickness of 5 µm was added to be interposed between the first base coat film and the resin substrate layer.

Test Example 29

Test Example 29 differed from Test Example 25 in that: the hard coat was constituted of a UV-curable nanosilica-silane-acrylate resin (with a modulus of elasticity of 5 GPa) and had a thickness of 5 µm; the color filter substrate was constituted of a polyethylene terephthalate resin (with a modulus of elasticity of 2 GPa) and had a thickness of 10 µm; an inorganic layer constituted of a silicon nitride film (with a modulus of elasticity of 81 GPa) having a thickness of 5 µm was added to be interposed between the color filter substrate and the second moisture-proof layer; the second moisture-proof layer had a thickness of 1 µm; the touch panel substrate was constituted of a polyimide resin (with a modulus of elasticity of 2 GPa) and having a thickness of 5 µm; the sealing film was constituted of a silicon nitride film (with a modulus of elasticity of 200 GPa) having a thickness of 10 µm; an inorganic layer constituted of a silicon nitride film (with a modulus of elasticity of 81 GPa) having a thickness of 5 µm was added to be interposed between the first base coat film and the resin substrate layer; and the resin substrate layer was constituted of a polyimide resin (with a modulus of elasticity of 2 GPa) and had a thickness of 10 µm.

Test Example 30

Test Example 30 differed from Test Example 25 in that: the hard coat had a thickness of 3 µm; and an inorganic layer constituted of a silicon nitride film (with a modulus of elasticity of 81 GPa) having a thickness of 2 µm was added to be provided on the back face of the resin substrate layer.

Test Example 31

Test Example 31 differed from Test Example 25 in that: the hard coat had a thickness of 3 µm; the color filter substrate had a thickness of 10 µm; the touch panel substrate had a thickness of 5 µm; the resin substrate layer had a thickness of 10 µm; and an inorganic layer constituted of a silicon nitride film (with a modulus of elasticity of 81 GPa) having a thickness of 2 µm was added to be provided on the back face of the resin substrate layer.

Test Example 32

Test Example 32 differed from Test Example 25 in that: the hard coat was constituted of a UV-curable nanosilica-silane-acrylate resin (with a modulus of elasticity of 5 GPa) and had a thickness of 5 µm; and an inorganic layer constituted of a silicon nitride film (with a modulus of elasticity of 81 GPa) having a thickness of 5 µm was added to be interposed between the color filter substrate and the second moisture-proof layer.

Test Example 33

Test Example 33 differed from Test Example 25 in that: the hard coat was constituted of a UV-curable nanosilica-silane-acrylate resin (with a modulus of elasticity of 5 GPa) and had a thickness of 5 µm; the color filter substrate was constituted of a polyethylene terephthalate resin (with a modulus of elasticity of 2 GPa) and had a thickness of 10 µm; an inorganic layer constituted of a silicon nitride film (with a modulus of elasticity of 81 GPa) having a thickness of 4.3 µm was added to be interposed between the color filter substrate and the second moisture-proof layer; the second moisture-proof layer had a thickness of 1 µm; the touch panel substrate was constituted of a polyimide resin (with a modulus of elasticity of 2 GPa) and having a thickness of 5 µm; the sealing film was constituted of a silicon nitride film (with a modulus of elasticity of 200 GPa) having a thickness of 10 µm; and the resin substrate layer was constituted of a polyimide resin (with a modulus of elasticity of 2 GPa) and had a thickness of 10 µm.

Test Example 34

Test Example 34 differed from Test Example 25 in that: the hard coat had a thickness of 1.5 µm; the color filter substrate was constituted of a polyethylene terephthalate resin (with a modulus of elasticity of 2 GPa) and had a thickness of 10 µm; the second moisture-proof layer had a thickness of 1 µm; the touch panel substrate was constituted of a polyimide resin (with a modulus of elasticity of 2 GPa) and having a thickness of 5 µm; the sealing film was constituted of a silicon nitride film (with a modulus of elasticity of 200 GPa) having a thickness of 10 µm; and the resin substrate layer was constituted of a polyimide resin (with a modulus of elasticity of 2 GPa) and had a thickness of 10 µm.

Test Example 35

Test Example 35 differed from Test Example 25 in that: the hard coat had a thickness of 3 µm.

Based on the results of Test Examples 25 to 35 (see the table of FIG. 21), a relationship between the inorganic rigidity rate and the radius of crease $r_c$ was graphed in FIG. 22. As can be seen, the radius of crease $r_c$ has a positive correlation with the inorganic rigidity rate. As will be described later, it has been found that a crease on the organic EL display device 50c highly probably has a radius of crease $r_c$ of 81 mm or larger (preferably 101 mm or larger) if the inorganic rigidity rate is 0.78 or higher and 1 or lower (preferably 0.83 or higher and 1 or lower).

As can be seen from the foregoing description, the organic EL display device 50c of this embodiment can provide the following advantages.

The inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower). As a result, the radius of crease $r_c$ of a crease on the organic EL display device 50c is likely to be 81 mm or larger (preferably 101 mm or larger). This feature can make a crease on the organic EL display device 50c inconspicuous, and prevent or reduce degradation in the quality of appearance of the organic EL display device 50c.

Further, in the organic EL display device 50c, the color filter substrate 25 functions also as a hard coat substrate. This feature allows the organic EL display device 50c to be thin, and enables reduction in costs for the components and the producing process.

Fourth Embodiment

Figure 23:
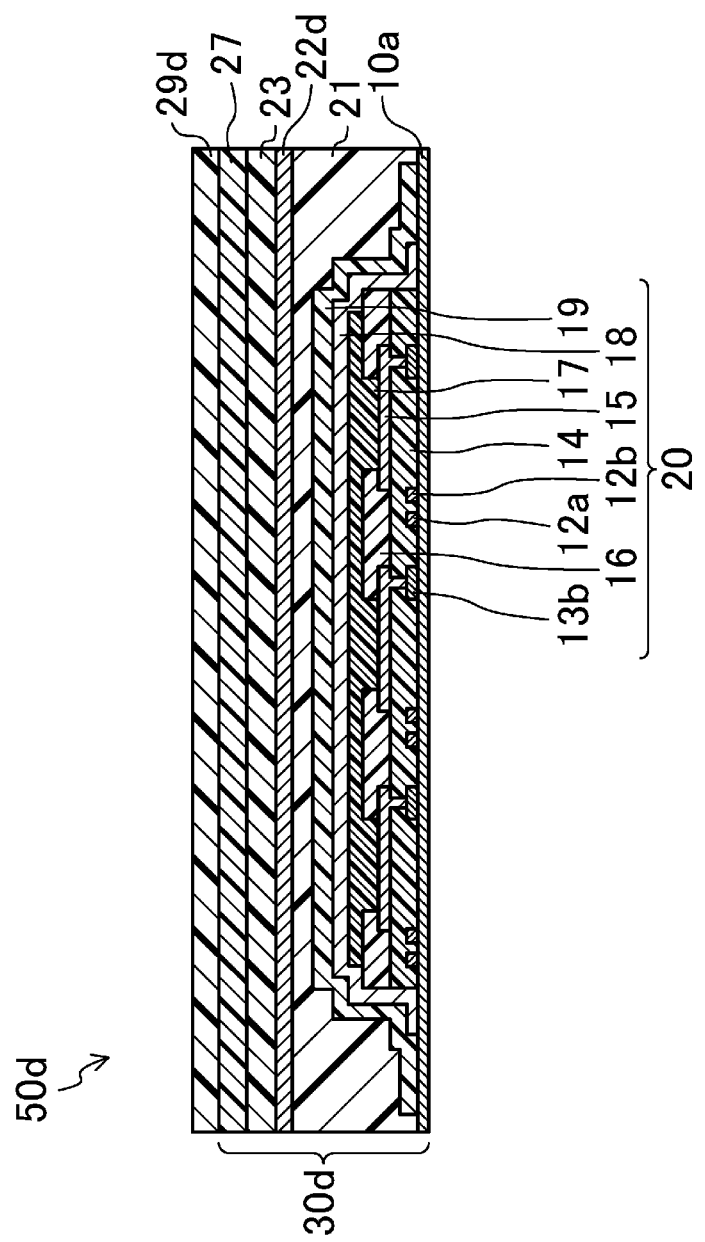
FIG. 23 is a cross-sectional view of an organic EL display device according to a fourth embodiment of the present invention.

FIGS. 23 to 26 show an organic EL display device according to a fourth embodiment of the present invention. Here, FIG. 23 is a cross-sectional view of the organic EL display device 50d according to this embodiment.

In the first, second, and third embodiments, the organic EL display devices 50a, 50b, and 50c each including the resin substrate layer have been exemplified. In this embodiment, the organic EL display device 50d that does not include any resin substrate layer is exemplified.

As shown in FIG. 23, the organic EL display device 50d includes: an organic EL display panel 30d; and a hard coat 29d provided on the organic EL display panel 30d. Note that the structure of each of pixels arranged in a display region of the organic EL display device 50d is substantially the same as that of each of the pixels arranged in the display region of the organic EL display device 50a of the first embodiment.

As shown in FIG. 23, the organic EL display panel 30d includes a base coat film 10a, an organic EL element layer 20, a color filter 23, and a touch panel 27. The organic EL element layer 20, the color filter 23, and the touch panel 27 are provided in this order over a surface (upper surface in FIG. 23) of the base coat film 10a.

The base coat film 10a is constituted of a single-layer film, such as a silicon nitride film, a silicon oxide film, a silicon oxynitride film, and the like, or a multilayer film of two or more of these films (in the below-mentioned Test Example 36, a multilayer film is adopted which includes a silicon oxide film provided as an upper layer and functioning as a second base coat film, and a silicon oxynitride film provided as a lower layer and functioning as a first base coat film).

A sealing film 19 of the organic EL element layer 20 is made of, for example, an inorganic material such as silicon dioxide ($SiO_2$), aluminum oxide ($Al_2O_3$), silicon nitride ($SiNx$, where x is a positive number) such as trisilicon tetranitride ($Si_3N_4$), silicon carbonitride (SiCN), and the like, or an organic material such as acrylate, polyurea, parylene, polyimide, polyamide, and the like (in the below-mentioned Test Example 36, silicon nitride is adopted).

As shown in FIG. 23, the color filter 23 is provided on a surface (a lower surface in FIG. 23) of the touch panel 27. As shown in FIG. 23, a moisture-proof layer 22d is provided on a surface (a lower surface in FIG. 23) of the color filter 23. As shown in FIG. 23, a filling layer 21 is provided between the organic EL element layer 20 and the moisture-proof layer 22d. The moisture-proof layer 22d is constituted of an inorganic insulating film made of, for example, a single-layer silicon nitride film, a single-layer silicon oxide film, a single-layer silicon oxynitride film, or the like, or a multilayer film including two or more of these films (in the below-mentioned Test Example 36, a single-layer silicon nitride film is adopted).

The touch panel 27 includes, for example, a touch panel substrate, a touch panel's first interconnecting layer provided on the back face of the touch panel substrate, and a touch panel's second interconnecting layer provided on the front face of the touch panel substrate. Thus, the touch panel 27 has a projected capacitive structure. The touch panel substrate is made of, for example, a polyimide resin, a polyethylene terephthalate resin, a polyethylene naphthalate resin, an aramid resin, a (meth)acrylate resin, or the like (in the below-mentioned Test Example 36, a polyimide resin is adopted). The touch panel's first interconnecting layer and the touch panel's second interconnecting layer are each made of a metal film of, for example, copper or the like (in the below-mentioned Test Example 36, copper is adopted).

The hard coat 29d is a hard coat layer provided on the touch panel 27 that functions also as a hard coat substrate. Here, the hard coat 29d is made of, for example, a UV-curable organosilicon resin, a thermosetting resin, an acrylic resin, a urethane resin, a polysiloxane resin, an inorganic insulating film, or the like (in the below-mentioned Test Example 36, a silicon nitride film is adopted).

Just like the organic EL display device 50a of the first embodiment, the organic EL display device 50d having the above configuration displays an image when a light-emitting layer 3 appropriately emits light in each of the sub-pixels P.

The organic EL display device 50d of this embodiment can be fabricated through appropriate modification of the method for fabricating the organic EL display device 50a of the first embodiment. Specifically, after the hard coat 29d is stacked, a resin substrate layer 10 is physically removed by means of a delamination layer (e.g., a layered structure including an oxide layer such as a silicon oxide layer and the like, and a nitride layer such as a titanium nitride layer and the like) which has been provided between the resin substrate layer 10 and the first base coat film 10a, thereby fabricating organic EL display device 50d.

As described earlier, the organic EL display device 50d is comprised of a device body including the plurality of organic layers made of organic materials and the plurality of inorganic layers made of inorganic materials, the plurality of organic layers and the plurality of inorganic layers being stacked together. The organic layers include, for example, the second protective insulating film, a main portion of the organic EL layer 17, the filling layer 21, the color filter 23, the touch panel substrate, and the like. The inorganic layers include, for example, the base coat film 10a, the gate insulating film, gate electrodes, the interlayer insulating film, the first protective insulating film, the sealing film 19, the moisture-proof layer 22d, the touch panel's first interconnecting layer, the touch panel's second interconnecting layer, the hard coat 29d, and the like.

As will be described later, in order to make a crease on the organic EL display device 50*d* have a radius of 100 mm or larger, the organic EL display device 50*d* is configured such that an inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower).

Figures 25, 26:
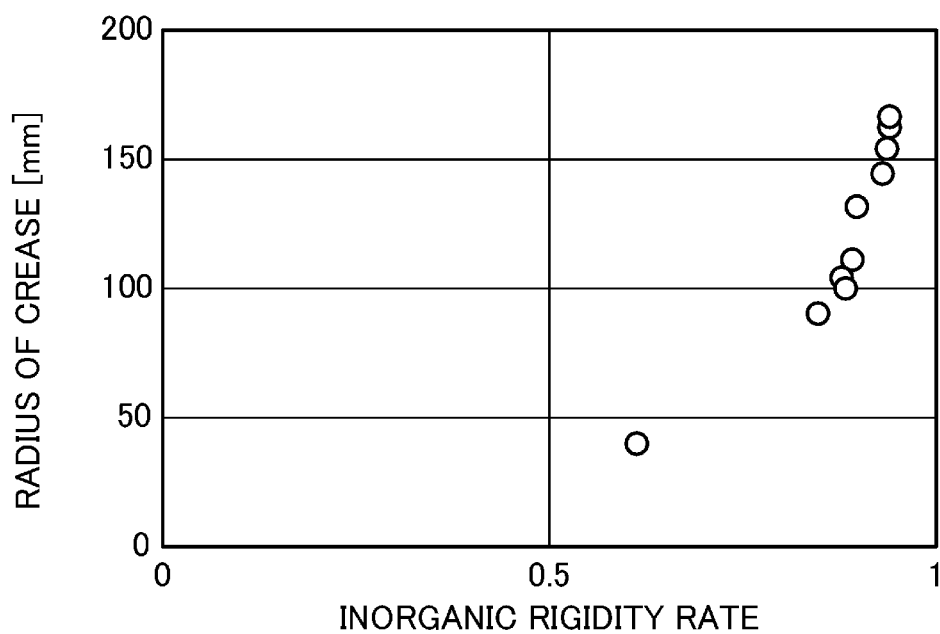
FIG. 25 is a table showing a radius of crease and an inorganic rigidity rate of each of Test Examples 36 to 46 that were specifically tested, as examples of the organic EL display device according to the fourth embodiment of the present invention.
FIG. 26 is a graph showing a relationship between the inorganic rigidity rate and the radius of crease of Test Examples 36 to 46 that were specifically tested, as examples of the organic EL display device according to the fourth embodiment of the present invention.

Next, tests that were specifically carried out will be described with reference to FIGS. 24 to 26. Here, FIG. 24 is a table showing the details of Test Example 36 that was specifically tested, as an example of the organic EL display device 50*d*. FIG. 25 is a table showing a radius of crease and an inorganic rigidity rate of each of Test Examples 36 to 46 that were specifically tested, as examples of the organic EL display device 50*d*. FIG. 26 is a graph showing a relationship between the inorganic rigidity rate and the radius of crease of Test Examples 36 to 46 that were specifically tested, as the example of the organic EL display device 50*d*.

As an example (Test Example 36) of this embodiment, an organic EL display device 50*d* having the configuration shown in the table of FIG. 24 and a size of 3.4 inches diagonal was prepared. An inorganic rigidity rate and a radius of crease $r_c$ of the organic EL display device 50*d* were determined in the same manner as in the first embodiment (see the table of FIG. 25).

Likewise, organic EL display devices of Test Examples 37 to 46 were each prepared under the following conditions, and an inorganic rigidity rate and a radius of crease $r_c$ were determined for each test example. In the following description of each of Test Examples, differences from Test Example 36 will be described.

Test Example 37

Test Example 37 differed from Test Example 36 in that: the hard coat was constituted of a UV-curable nanosilica-silane-acrylate resin (with a modulus of elasticity of 9.2 GPa) and had a thickness of 10 μm; an inorganic layer constituted of a silicon nitride film (with a modulus of elasticity of 228 GPa) having a thickness of 0.5 μm was added to be interposed between the hard coat and the touch panel; and the touch panel substrate had a thickness of 16 μm.

Test Example 38

Test Example 38 differed from Test Example 36 in that: the hard coat was constituted of a UV-curable nanosilica-silane-acrylate resin (with a modulus of elasticity of 5 GPa) and had a thickness of 5 μm; an inorganic layer constituted of a silicon nitride film (with a modulus of elasticity of 228 GPa) having a thickness of 1 μm was added to be interposed between the hard coat and the touch panel; the touch panel substrate was constituted of a polyimide resin (with a modulus of elasticity of 2 GPa) and having a thickness of 5 μm; and the sealing film was constituted of a silicon nitride film (with a modulus of elasticity of 200 GPa) having a thickness of 10 μm.

Test Example 39

Test Example 39 differed from Test Example 36 in that: the hard coat was constituted of a UV-curable nanosilica-silane-acrylate resin (with a modulus of elasticity of 5 GPa) and had a thickness of 5 μm; an inorganic layer constituted of a silicon nitride film (with a modulus of elasticity of 81 GPa) having a thickness of 2.5 μm, and an inorganic layer constituted of a silicon nitride film (with a modulus of elasticity of 228 GPa) having a thickness of 0.5 μm were added to be interposed between the hard coat and the touch panel such that the former inorganic layer was located adjacent to the hard coat and the latter inorganic layer was located adjacent to the touch panel; the touch panel substrate had a thickness of 16 μm; and an inorganic layer constituted of a silicon nitride film (with a modulus of elasticity of 81 GPa) having a thickness of 2 μm was added to be located on the back face of the first base coat film.

Test Example 40

Test Example 40 differed from Test Example 36 in that: the hard coat was constituted of a UV-curable nanosilica-silane-acrylate resin (with a modulus of elasticity of 9.1 GPa) and had a thickness of 5 μm; an inorganic layer constituted of a silicon nitride film (with a modulus of elasticity of 81 GPa) having a thickness of 3 μm, and an inorganic layer constituted of a silicon nitride film (with a modulus of elasticity of 228 GPa) having a thickness of 1 μm were added to be interposed between the hard coat and the touch panel such that the former inorganic layer was located adjacent to the hard coat and the latter inorganic layer was located adjacent to the touch panel; the touch panel substrate was constituted of a polyimide resin (with a modulus of elasticity of 2 GPa) and having a thickness of 5 μm; the sealing film was constituted of a silicon nitride film (with a modulus of elasticity of 200 GPa) having a thickness of 3.5 μm; and an inorganic layer constituted of a silicon nitride film (with a modulus of elasticity of 81 GPa) having a thickness of 2 μm was added to be located on the back face of the first base coat film.

Test Example 41

Test Example 41 differed from Test Example 36 in that: the hard coat was constituted of a silicon nitride film (with a modulus of elasticity of 81 GPa) having a thickness of 2 μm; an inorganic layer constituted of a silicon nitride film (with a modulus of elasticity of 228 GPa) having a thickness of 0.5 μm was added to be interposed between the hard coat and the touch panel; the touch panel substrate had a thickness of 16 μm; and an inorganic layer constituted of a silicon nitride film (with a modulus of elasticity of 81 GPa) having a thickness of 2 μm was added to be located on the back face of the first base coat film.

Test Example 42

Test Example 42 differed from Test Example 36 in that: the hard coat was constituted of a silicon nitride film (with a modulus of elasticity of 81 GPa) having a thickness of 1.5 μm; an inorganic layer constituted of a silicon nitride film (with a modulus of elasticity of 228 GPa) having a thickness of 0.5 μm was added to be interposed between the hard coat and the touch panel; the sealing film had a thickness of 10 μm; and an inorganic layer constituted of a silicon nitride film (with a modulus of elasticity of 81 GPa) having a thickness of 1.5 μm was added to be located on the back face of the first base coat film.

Test Example 43

Test Example 43 differed from Test Example 36 in that: the hard coat was constituted of a UV-curable nanosilicasilane-acrylate resin (with a modulus of elasticity of 5 GPa) and had a thickness of 5 µm; an inorganic layer constituted of a silicon nitride film (with a modulus of elasticity of 81 GPa) having a thickness of 2.5 µm, and an inorganic layer constituted of a silicon nitride film (with a modulus of elasticity of 228 GPa) having a thickness of 0.5 µm were added to be interposed between the hard coat and the touch panel such that the former inorganic layer was located adjacent to the hard coat and the latter inorganic layer was located adjacent to the touch panel; and the touch panel substrate had a thickness of 16 µm.

Test Example 44

Test Example 44 differed from Test Example 36 in that: the hard coat was constituted of a UV-curable nanosilica-silane-acrylate resin (with a modulus of elasticity of 9.1 GPa) and had a thickness of 5 µm; an inorganic layer constituted of a silicon nitride film (with a modulus of elasticity of 81 GPa) having a thickness of 0.75 µm, and an inorganic layer constituted of a silicon nitride film (with a modulus of elasticity of 228 GPa) having a thickness of 1 µm were added to be interposed between the hard coat and the touch panel such that the former inorganic layer was located adjacent to the hard coat and the latter inorganic layer was located adjacent to the touch panel; the touch panel substrate was constituted of a polyimide resin (with a modulus of elasticity of 2 GPa) and having a thickness of 5 µm; and the sealing film was constituted of a silicon nitride film (with a modulus of elasticity of 200 GPa) having a thickness of 3.5 µm.

Test Example 45

Test Example 45 differed from Test Example 36 in that: the hard coat was constituted of a silicon nitride film (with a modulus of elasticity of 81 GPa) having a thickness of 3 µm; an inorganic layer constituted of a silicon nitride film (with a modulus of elasticity of 228 GPa) having a thickness of 0.5 µm was added to be interposed between the hard coat and the touch panel; and the touch panel substrate had a thickness of 16 µm.

Test Example 46

Test Example 46 differed from Test Example 36 in that: the hard coat was constituted of a silicon nitride film (with a modulus of elasticity of 81 GPa) having a thickness of 2 µm; an inorganic layer constituted of a silicon nitride film (with a modulus of elasticity of 228 GPa) having a thickness of 0.5 µm was added to be interposed between the hard coat and the touch panel; and the sealing film had a thickness of 10 µm.

Based on the results of Test Examples 36 to 46 (see the table of FIG. 25), a relationship between the inorganic rigidity rate and the radius of crease $r_c$ was graphed in FIG. 26. As can be seen, the radius of crease $r_c$ has a positive correlation with the inorganic rigidity rate. As will be described later, it has been found that a crease on the organic EL display device 50d highly probably has a radius of crease $r_c$ of 81 mm or larger (preferably 101 mm or larger) if the inorganic rigidity rate is 0.78 or higher and 1 or lower (preferably 0.83 or higher and 1 or lower).

Figures 27, 28:
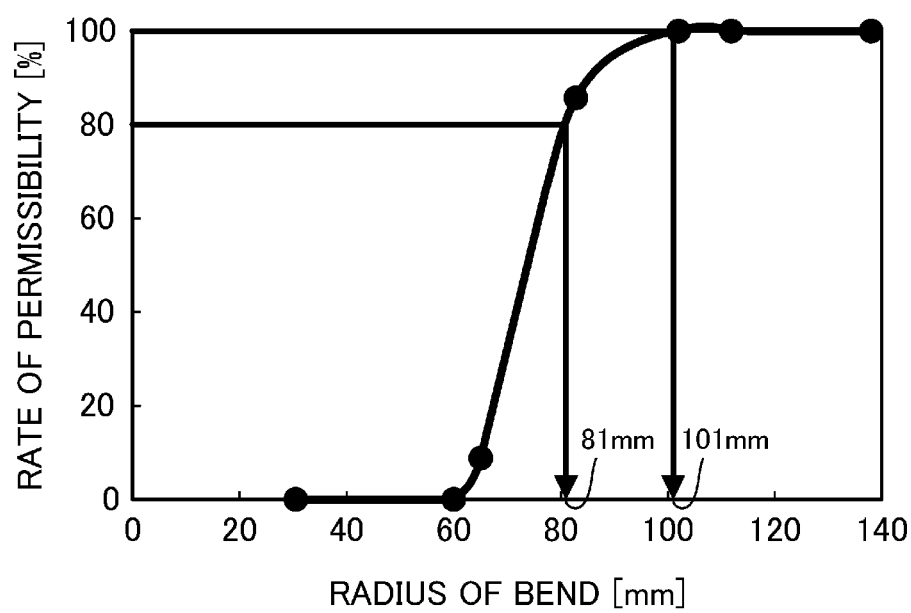
FIG. 27 is a table showing results of specific evaluation of a radius of bend (radius of crease) of the organic EL display device according to each of the first to fourth embodiments of the present invention.
FIG. 28 is a graph showing a relationship between a radius of bend (radius of crease) and a rate of permissibility of the organic EL display device according to each of the first to fourth embodiments of the present invention.
Figure 29:
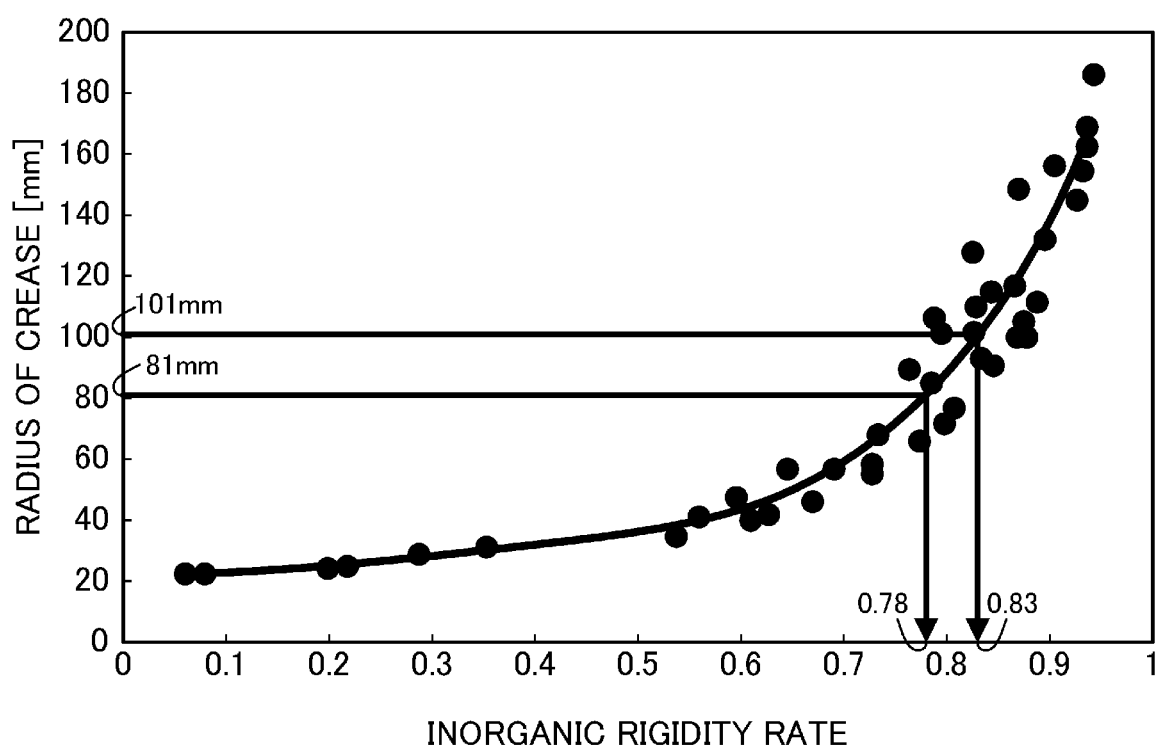
FIG. 29 is a graph showing a relationship between an inorganic rigidity rate and a radius of crease of Test Examples 1 to 46 that were specifically tested, as examples of the organic EL display devices according to the first to fourth embodiments of the present invention.

A permissible range for the radius of crease $r_c$ and inorganic rigidity rates corresponding to the permissible range will be described below. FIG. 27 is a table showing results of specific evaluation of a radius of bend (the radius of crease) of the organic EL display devices according to the first to fourth embodiments. FIG. 28 is a graph showing a relationship between the radius of bend (radius of crease) and a rate of permissibility of the organic EL display devices according to the first to fourth embodiments. FIG. 29 is a graph showing a relationship between the inorganic rigidity rate and the radius of crease of Test Examples 1 to 46 that were specifically tested, as the examples of the organic EL display devices according to the first to fourth embodiments.

Specifically, organic EL display devices having a size of 3.4 inches diagonal (e.g., the organic EL display devices 50a) were deformed to different extents so as to have seven different radii of bend (see the table of FIG. 27). Each of the organic EL display devices having the different radii of bend was subjectively evaluated by 22 testers on a one-to-three scale (namely, Level 1: inconspicuous, Level 2: permissible, Level 3: impermissible). The evaluation results were obtained through questionnaires.

The results are shown in the table of FIG. 27 and the graph of FIG. 28. According to the approximate curve in the graph, it has been found that the radius of bend needs to be 81 mm or larger in order to obtain a rate of permissibility of at least 80%, where the rate of permissibility is calculated according to the following expression: (the total number of testers selecting Levels 1 and 2)/(total number of testers selecting Levels 1, 2 and 3)×100. It has also been found that the radius of bend needs to be 101 mm or larger in order to obtain a rate of permissibility of 100%. Note that the radius of bend as used herein corresponds to the radius of a mark of bend (a radius of crease) of an organic EL display device.

Based on the results of Test Examples 1 to 46 of the first to third embodiments and this embodiment, a relationship between the inorganic rigidity rate and the radius of crease was graphed in FIG. 29. The approximate curve shown in this graph indicates that the inorganic rigidity rate needs to be 0.78 or higher (and 1 or lower) to make a radius of crease amount to 81 mm or larger, and that the inorganic rigidity rate needs to be 0.83 or higher (and 1 or lower) to make a radius of crease amount to 101 mm or larger.

As described above, the organic EL display device 50d of this embodiment can provide the following advantages.

The inorganic rigidity rate, which is obtained by dividing the sum of the flexural rigidities of the plurality of inorganic layers by the sum total of the sum of the flexural rigidities of the plurality of organic layers and the sum of the flexural rigidities of the plurality of inorganic layers, is 0.78 or higher and 1 or lower (preferably 0.83 or higher and 1 or lower). As a result, the radius of crease $r_c$ of a crease on the organic EL display device 50d is likely to be 81 mm or larger (preferably 101 mm or larger). This feature can make a crease on the organic EL display device 50d inconspicuous, and prevent or reduce degradation in the quality of appearance of the organic EL display device 50d.

Further, in the organic EL display device 50d, no resin substrate layer is provided, and the touch panel 27 functions as both a color filter substrate and a hard coat substrate. This feature allows the organic EL display device 50d to be thin, and enables reduction in costs for the components and the producing process.

Other Embodiments

In each of the above embodiments, the organic EL display devices 50a to 50d including the color filter have been exemplified. Alternatively, the present invention is applicable to an organic EL display device including no color filter while being provided with a polarizing plate.

In each of the above embodiments, the organic EL layer has been exemplified as a layer having a stacked structure of the five layers, namely, the positive hole injection layer, a positive hole transport layer, the light-emitting layer, the electron transport layer, and the electron injection layer. Alternatively, the organic EL layer may have a stacked structure of three layers including a positive hole injection-transport layer, a light-emitting layer, and an electron transport-injection layer, for example.

In each of the above embodiments, the organic EL display device in which the first electrode functions as the anode electrode and the second electrode functions as the cathode electrode has been exemplified. Alternatively, the present invention is applicable to an organic EL display device in which the multilayer structure of the organic EL layer is inverted, the first electrode functions as the cathode electrode, and the second electrode functions as the anode electrode.

In each of the above embodiments, the organic EL display device including the TFT having, as the drain electrode, an electrode connected to the first electrode has been exemplified. Alternatively, the present invention is applicable to an organic EL display device including a TFT having an electrode connected to the first electrode and called a source electrode.

In the above embodiments, the organic EL display devices 50a to 50d have been exemplified. Alternatively, the present invention is applicable to an organic EL display device including any combination of two or more of the multilayered structure of the exemplified organic EL display devices 50a to 50d.

INDUSTRIAL APPLICABILITY

As described above, the present invention is useful for a flexible organic EL display device.

DESCRIPTION OF REFERENCE CHARACTERS

7 Rigidifying Layer (Inorganic Layer)
23 Color Filter (Organic Layer)
27 Touch Panel
29, 29c, 29d Hard Coat
30a-30d Organic EL Display Panel
50d-50d Organic EL Display Device

The invention claimed is:

1. A display device comprising:
a plurality of organic layers each made of an organic material and each having a modulus of elasticity and a thickness; and
a plurality of inorganic layers each made of an inorganic material and each having a modulus of elasticity and a thickness,
the plurality of organic layers and the plurality of inorganic layers being stacked together to constitute a device body which defines the display device, wherein
a quotient is obtained by: (i) dividing a sum of flexural rigidities of the plurality of inorganic layers by (ii) a sum total of a sum of flexural rigidities of the plurality of organic layers plus the sum of the flexural rigidities of the plurality of inorganic layers, the quotient is 0.78 or higher and 1 or lower.

2. The display device of claim 1, wherein the quotient is 0.83 or higher and 1 or lower.

3. The display device of claim 1, the device satisfying Expression 1

$$\lambda = \frac{\sum_{i=1}^{n} E_i(h_i^2 - h_{i-1}^2)}{2\sum_{i=1}^{n} E_i(h_i + h_{i-1})}$$ [Exp. 1]

wherein λ represents a distance (μm) from one surface of the device body to a neutral plane of the device body,
Ei represents a modulus of elasticity (Pa) of one organic or inorganic layer included in the plurality of organic or inorganic layers and constituting an i-th layer (where i is a natural number from 1 to n) from the one surface of the device body, and
hi represents a distance (μm) from the one surface of the device body to a surface, of the one organic or inorganic layer constituting the i-th layer, facing the other surface of the device body.

4. The display device of claim 3, wherein
the one organic or inorganic layer constituting the i-th layer has a flexural rigidity EiIi satisfying an expression:

$$EiIi = bEi\{(hi-\lambda)3 - (hi-1-\lambda)3\}/3,$$

wherein b is a width of the device body, the width being parallel to a center axis of a radius of bend of the device body.

5. The display device of claim 1, wherein the plurality of inorganic layers includes a hard coat on a first surface of the device body.

6. The display device of claim 5, wherein the hard coat has a highest flexural rigidity of the plurality of inorganic layers.

7. The display device of claim 1, wherein the plurality of inorganic layers includes a rigidifying layer on a second surface of the device body.

8. The display device of claim 7, wherein the rigidifying layer has a second highest flexural rigidity of the plurality of inorganic layers.

9. The display device of claim 1, wherein, the device body includes a display panel which has a color filter, and a touch panel which is stacked on the display panel.

10. The display device of claim 1, wherein, the device body includes a display panel including a color filter and a touch panel.

11. The display device of claim 9, wherein the display panel is an organic electroluminescence (EL) display panel.

12. The display device of claim 10, wherein the display panel is an organic electroluminescence (EL) display panel.

* * * * *